(12) United States Patent
Cok

(10) Patent No.: US 7,674,712 B2
(45) Date of Patent: *Mar. 9, 2010

(54) PATTERNING METHOD FOR LIGHT-EMITTING DEVICES

(76) Inventor: Ronald S. Cok, 343 State St., Rochester, NY (US) 14650

( * ) Notice: Subject to any disclaimer, the term of this patent is extended or adjusted under 35 U.S.C. 154(b) by 0 days.

This patent is subject to a terminal disclaimer.

(21) Appl. No.: 11/876,334

(22) Filed: Oct. 22, 2007

(65) Prior Publication Data

US 2009/0104785 A1    Apr. 23, 2009

(51) Int. Cl.
H01L 21/44 (2006.01)
H01L 21/76 (2006.01)

(52) U.S. Cl. .................. 438/675; 438/405; 438/424; 438/430; 438/497; 438/597; 438/598; 438/666; 438/669; 438/620; 438/672; 438/386; 438/549; 438/618; 438/644; 257/774; 257/678; 257/E23.174; 257/E21.575; 257/E21.627; 257/E21.641

(58) Field of Classification Search .................. None
See application file for complete search history.

(56) References Cited

U.S. PATENT DOCUMENTS

| | | | | |
|---|---|---|---|---|
| 4,210,711 A | * | 7/1980 | Kitajima et al. | 430/253 |
| 4,247,619 A | * | 1/1981 | Cohen et al. | 430/253 |
| 4,476,292 A | | 10/1984 | Ham et al. | |
| 4,769,292 A | | 9/1988 | Tang et al. | |
| 5,234,790 A | * | 8/1993 | Lang et al. | 430/253 |
| 5,247,190 A | | 9/1993 | Friend et al. | |
| 5,522,963 A | | 6/1996 | Anders, Jr. et al. | |
| 5,747,222 A | * | 5/1998 | Ryu | 430/312 |
| 6,146,715 A | * | 11/2000 | Kim et al. | 427/555 |
| 6,392,340 B2 | | 5/2002 | Yoneda et al. | |
| 6,703,298 B2 | | 3/2004 | Roizin et al. | |
| 6,756,317 B2 | * | 6/2004 | Sniegowski et al. | 438/745 |

(Continued)

FOREIGN PATENT DOCUMENTS

WO    WO 2004/036663 A    4/2004

(Continued)

OTHER PUBLICATIONS

Tang et al., "Organic electroluminescent diodes", Applied Physics Letters 51, Sep. 21, 1987, pp. 913-915.

(Continued)

*Primary Examiner*—Charles D Garber
*Assistant Examiner*—Pape Sene
(74) *Attorney, Agent, or Firm*—Morgan Lewis & Bockius LLP

(57) ABSTRACT

A method of patterning a substrate by mechanically locating a first masking film over the substrate; removing one or more first opening portions in first locations in the first masking film to form one or more first masking portions in the first masking film. First materials are deposited over the substrate in the first locations to form first patterned areas before mechanically locating a second masking film over the substrate and first masking portions. One or more second opening portions are removed from second locations, different from the first locations, in both the second masking film and the first masking portions to form one or more second masking portions. Second materials are deposited over the substrate in the second locations to form second patterned areas.

14 Claims, 25 Drawing Sheets

U.S. PATENT DOCUMENTS

| | | | |
|---|---|---|---|
| 2003/0022403 A1* | 1/2003 | Shimoda et al. | 438/14 |
| 2003/0203551 A1* | 10/2003 | Cok et al. | 438/200 |
| 2003/0211406 A1* | 11/2003 | Keusseyan | 430/14 |
| 2004/0256727 A1* | 12/2004 | Aoyagi et al. | 257/758 |
| 2006/0099731 A1* | 5/2006 | Buckley et al. | 438/99 |
| 2006/0145146 A1* | 7/2006 | Suh et al. | 257/40 |
| 2006/0283539 A1 | 12/2006 | Slafer et al. | |
| 2008/0241989 A1* | 10/2008 | Cok et al. | 438/99 |
| 2008/0254555 A1* | 10/2008 | Cok | 438/22 |

FOREIGN PATENT DOCUMENTS

| | | |
|---|---|---|
| WO | 2006/111766 | 10/2006 |
| WO | WO 2008/118456 A | 10/2008 |
| WO | WO 2008/130491 A | 10/2008 |

OTHER PUBLICATIONS

Tang et al., "Electroluminescence of doped organic thin films," Journal of Applied Physics, May 1, 1989, pp. 3610-3616.

* cited by examiner

PATTERNING METHOD FOR LIGHT-EMITTING DEVICES

FIELD OF THE INVENTION

The present invention relates to forming light-emitting devices, and more particularly to a method for depositing organic and inorganic light-emitting materials in a pattern over a substrate.

BACKGROUND OF THE INVENTION

Light-emitting diodes (LEDs) are a promising technology for flat-panel displays and area illumination lamps. The technology relies upon thin-film layers of materials coated upon a substrate. Organic LED devices generally can have two formats known as small-molecule devices such as disclosed in U.S. Pat. No. 4,476,292, issued Oct. 9, 1984, by Ham et al., and polymer-OLED devices such as disclosed in U.S. Pat. No. 5,247,190, issued Sep. 21, 1993, by Friend et al. Either type of OLED device may include, in sequence, an anode, an organic electroluminescent (EL) element, and a cathode. The organic EL element disposed between the anode and the cathode commonly includes an organic hole-transporting layer (HTL), an emissive layer (EML) and an organic electron-transporting layer (ETL). Holes and electrons recombine and emit light in the EML layer. Tang et al. (Applied Physics Letter, 51, 913 (1987), Journal of Applied Physics, 65, 3610 (1989), and U.S. Pat. No. 4,769,292, issued Sep. 6, 1988) demonstrated highly efficient OLEDs using such a layer structure. Since then, numerous OLEDs with alternative layer structures, including polymeric materials, have been disclosed and device performance has been improved. The use of inorganic light-emitting materials, for example quantum dot particles, is also known in the art.

Light is generated in an LED device when electrons and holes that are injected from the cathode and anode, respectively, flow through the electron-transport layer and the hole-transport layer and recombine in the emissive layer. Many factors determine the efficiency of this light-generating process. For example, the selection of anode and cathode materials can determine how efficiently the electrons and holes are injected into the device; the selection of ETL and HTL can determine how efficiently the electrons and holes are transported in the device, and the selection of EML can determine how efficiently the electrons and holes are recombined and emit light.

A typical LED device uses a glass substrate, a transparent conducting anode such as indium-tin-oxide (ITO), a stack of organic layers, and a reflective cathode layer. Light generated from such a device may be emitted through the glass substrate. This is commonly referred to as a bottom-emitting device. Alternatively, a device can include a substrate, a reflective anode, a stack of organic layers, and a top transparent electrode layer. Light generated from such an alternative device may be emitted through the top transparent electrode. This is commonly referred to as a top-emitting device.

LED devices can employ a variety of light-emitting materials patterned over a substrate that emit light of a variety of different frequencies, for example red, green, and blue, to create a full-color display. For small-molecule organic materials, such patterned deposition is done by evaporating materials and is quite difficult, requiring, for example, expensive metal shadow-masks. Each mask is unique to each pattern and device design. These masks are difficult to fabricate and must be cleaned and replaced frequently. Material deposited on the mask in prior manufacturing cycles may flake off and cause particulate contamination. Moreover, aligning shadow-masks to a substrate is problematic and often damages the materials already deposited on the substrate. Further, the masks are subject to thermal expansion during the OLED material deposition process, reducing the deposition precision and limiting the resolution and size at which the pattern may be formed. Polymer OLED materials may be deposited in liquid form and patterned using expensive photolithographic techniques.

Alternatively, skilled practitioners employ a combination of emitters, or an unpatterned broad-band emitter, to emit white light together with patterned color filters, for example, red, green, and blue, to create a full-color display. The color filters are located on the substrate, for a bottom-emitter, or on the cover, for a top-emitter. For example, U.S. Pat. No. 6,392,340 entitled "Color Display Apparatus Having Electroluminescence Elements" issued May 21, 2002, by Yoneda et al., illustrates such a device. However, such designs are relatively inefficient, since approximately two-thirds of the light emitted may be absorbed by the color filters.

WO2006/111766, published Oct. 26, 2006, by Speakman et al., describes a method of manufacturing, comprising applying a mask to a substrate; forming a pattern in the mask; processing the substrate according to the pattern; and mechanically removing the mask from the substrate. A method of manufacturing an integrated circuit is also disclosed. In this disclosure, the use of multiple masking steps is disclosed. However, providing multiple masking steps can introduce particulate contamination and may damage materials deposited in previously patterned areas.

Patterning a flexible substrate within a roll-to-roll manufacturing environment is also known and described in US2006/0283539, published Dec. 21, 2006, by Slafer et al. However, such a method is not readily employed with multiple patterned substrates employing evaporated deposition. Disposable masks are also disclosed in U.S. Pat. No. 5,522,963, issued Jun. 4, 1996, by Anders, Jr. et al., and a process of laminating a mask to a ceramic substrate is also described. However, a teaching of registering a mask to the substrate is limited in registration and size. A self-aligned process is described in U.S. Pat. No. 6,703,298, issued Mar. 9, 2004, by Roizin et al., for making memory cells. A sputtered disposable mask is patterned and removed by etching. However, as with the prior-art disclosures cited above, the formation of the patterned mask by employing multiple masking, deposition, and processing steps, are not compatible with delicate, especially organic, materials such as are found in OLED displays.

There is a need, therefore, for an improved method for patterning materials over a substrate that improves resolution and efficiency, reduces damage to underlying layers, reduces particulate contamination, scales to large-size substrates, and reduces manufacturing costs.

SUMMARY OF THE INVENTION

The aforementioned need is met in accordance with at least one exemplary embodiment of the present invention that provides a method of patterning a substrate. The method includes the steps of:

a) mechanically locating a first masking film over the substrate;

b) removing one or more first opening portions in first locations in the first masking film forming one or more first masking portions in the first masking film;

c) depositing first materials over the substrate in the first locations to form first patterned areas;

d) mechanically locating a second masking film over the substrate and first masking portions;

e) removing one or more second opening portions in second locations, different from the first locations, in both the second masking film and the first masking portions to form one or more second masking portions; and f) depositing second materials over the substrate in the second locations to form second patterned areas.

ADVANTAGES

The method of the present invention has the advantage that it improves resolution and efficiency, reduces damage to underlying layers, reduces particulate contamination, scales to large-size substrates, and reduces manufacturing costs for a patterned light-emitting device formed on a substrate.

It will be understood that the figures are not to scale since the individual components have too great a range of sizes and thicknesses to permit depiction to scale.

DETAILED DESCRIPTION OF THE INVENTION

Figure 1:
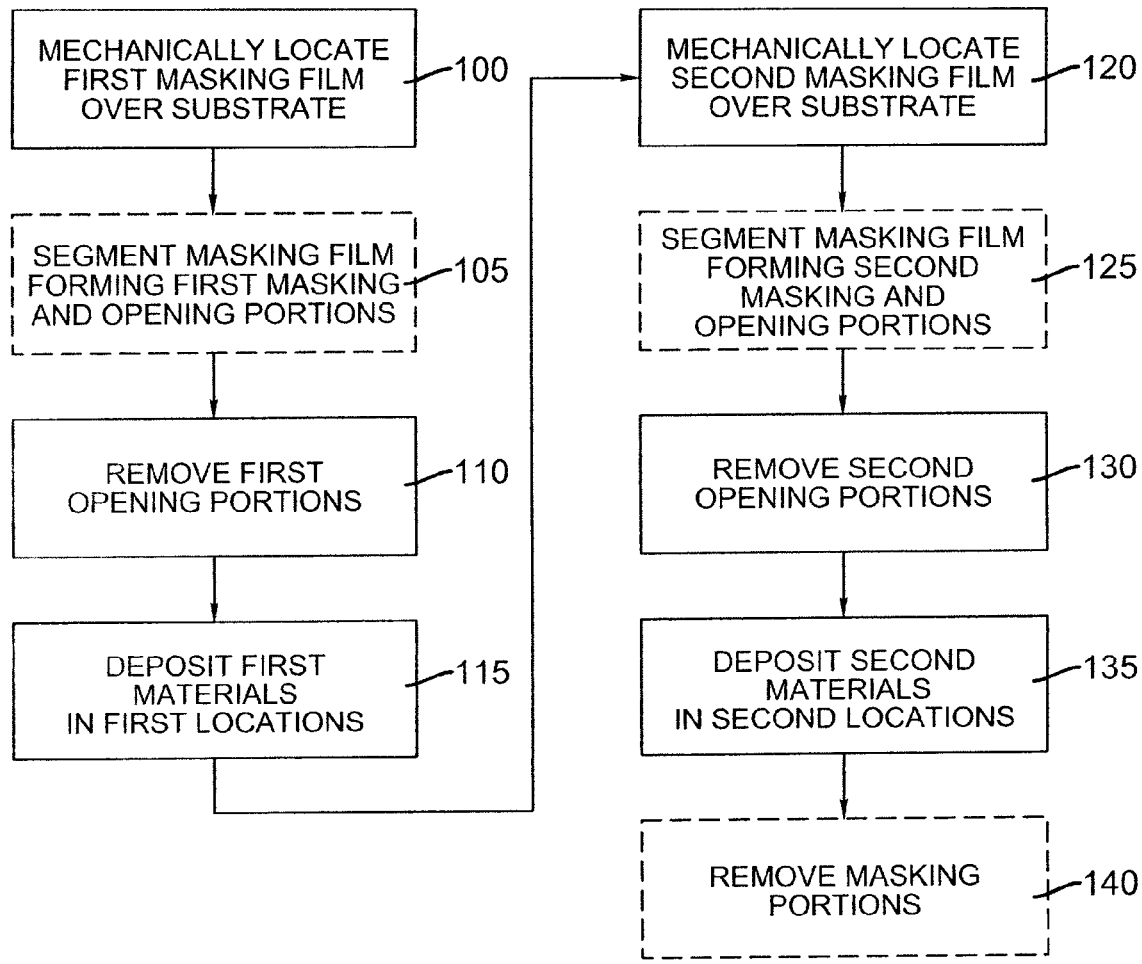
FIG. 1 is a flow chart illustrating a method of patterning a substrate according to one embodiment of the present invention.

Referring to FIG. 1, in accordance with one embodiment of the present invention, a method of patterning a substrate comprises the steps of mechanically locating 100 a first masking film over a substrate, optionally segmenting 105 the first masking film into a first masking portion and one or more first opening portions in first locations, removing 110 the one or more first opening portions, depositing 115 first materials over the substrate in the first locations to form first patterned areas. A second masking film is mechanically located 120 over the substrate and first masking portion, and optionally segmented 125 into a second masking portion and one or more second opening portions in second locations. The second opening portions are in one or more second locations over the substrate, yet different from the first locations. By locating the second opening portions in different locations from the first, different portions of the substrate are exposed and different materials may be deposited thereon; thereby patterning the substrate with different materials in different locations. The patterning locations may be determined according to the design and application for which the substrate is intended. For example, a cell-phone display device will have pixel areas according to one design and a flat-panel television will have pixel areas according to a different design. The first and second locations can overlap, so that portions of the first and second locations will have both first and second materials deposited thereon, if the opening portion removal process does not damage any material already deposited in a location, for example inorganic materials or metal layers. The first or second opening portions can be contiguous, so as to enhance the mechanical robustness of the film and to aid removal. The one or more second opening portions are removed 130, and second materials deposited 135 over the substrate in the second locations. In an optional step, both the first and second masking portions are removed 140 after the second materials are deposited.

Additionally, one can employ a computer storage medium/product having instructions stored therein for causing a computer to perform the steps shown in FIG. 1. Those skilled in the art should understand that the computer storage medium or computer program product of the present invention may make use of algorithms and processes that are well known. Accordingly, the present description is directed in particular to those algorithms and processes forming part of, or cooperating more directly with, the method of the present invention. Thus, it should be understood that the computer program product embodiment of the present invention can embody algorithms and processes not specifically shown or described herein that are useful for implementation. Such algorithms and processes are conventional and within the ordinary skill in such arts.

Other aspects of such algorithms and systems, and hardware and/or software for producing or co-operating with the computer program product of the present invention, are not specifically shown or described herein and may be selected from such algorithms, systems, hardware, components, and elements known in the art.

Therefore, a computer program for performing the method of the present invention (as exemplarily depicted in FIG. 1) may be stored in a computer readable storage medium that comprises, for example: magnetic storage media such as a magnetic disk (such as a hard drive or a floppy disk) or magnetic tape; optical storage media such as an optical disc, optical tape, or machine readable bar code; solid state electronic storage devices such as random access memory (RAM), or read only memory (ROM); or any other physical device or medium employed to store a computer program. The computer program for performing the method of the present invention can also be stored on computer readable storage medium that is connected to the image processor by way of the Internet or other communication medium. Those skilled in the art will readily recognize that the equivalent of such a computer program product can also be constructed in hardware or firmware known as application specific integrated circuits (ASICs).

In a different embodiment of the present invention, the steps of mechanically locating a third masking film over the substrate and second masking portions, optionally segmenting the third masking film and second masking portion into a third masking portion and one or more third opening portions, wherein the third opening portions are in one or more third locations over the substrate different from the first and second locations, removing the one or more third opening portions, and depositing third materials over the substrate in the third locations to form third patterned areas may be employed and are similar to the steps 120 through 135 in FIG. 1. In a further optional step, the first, second, and third masking portions are all removed after the third materials are deposited. Such steps can be repeated to provide patterned material deposition over any number of locations on the substrate.

The steps 110 and 130 of removing opening portions are performed in a variety of ways, several of which are included in the present invention. In one method, the material comprising the masking film in the opening portions is ablated, for example by a laser, chemically removed, for example by means of etching through a photolithographic mask formed on the mask film, or mechanical means are used. In an alternative method that employs a laser, a perimeter of the first or second opening portions is ablated, thereby segmenting the opening portions from the masking portions of the mask film. The opening portions are then detached from the masking portions and can be mechanically removed.

The present invention provides a process for the iterative deposition of a variety of materials in a pattern over a substrate. It is notable that, with the present invention, each opening portion is subsequently covered by a masking film for subsequent steps, thereby protecting each deposition area from contamination. This is in sharp contrast to prior-art methods that employ a series of masks that are subsequently removed after each material is deposited and before the next material is deposited, thereby exposing previously deposited materials to environmental contamination and stress. In such methods, control of particle contamination is critical, especially for devices such as organic light-emitting diodes. Hence, the present invention greatly reduces the exposure of locations on the substrate to an external environment by reducing the number of processing steps and, especially, maintaining a protective mask layer over the areas of the substrate on which materials are not being deposited.

The opening portions in the masking films are registered to the substrate. To enhance such registration, and the removal of the opening portions, adhesive layers can be provided between the mask films. Moreover, the removal of the masking portions should not damage any underlying layers. Hence, according to various embodiments of the present invention, the adhesive layer is located between the second masking film and the first masking film, between the second masking film and the first masking portions, or between the second masking film and the first opening portions. The second masking film is then adhered to the first masking film, the first masking portions, or the first opening portions. The adhesive layer can be formed on the first masking film before the first masking film is located over the substrate; or the adhesive layer can be formed on the first masking film after the first masking film is located over the substrate prior to the removal of the first opening portions; or the adhesive layer can be formed on the first masking portions after the first opening portions are removed.

Figure 2A:
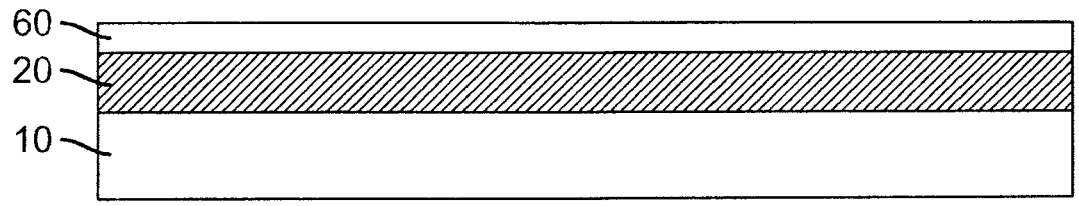
FIGS. 2A-2J are sequential side views of the construction of a patterned substrate according to an exemplary embodiment of the present invention.
Figure 2B:
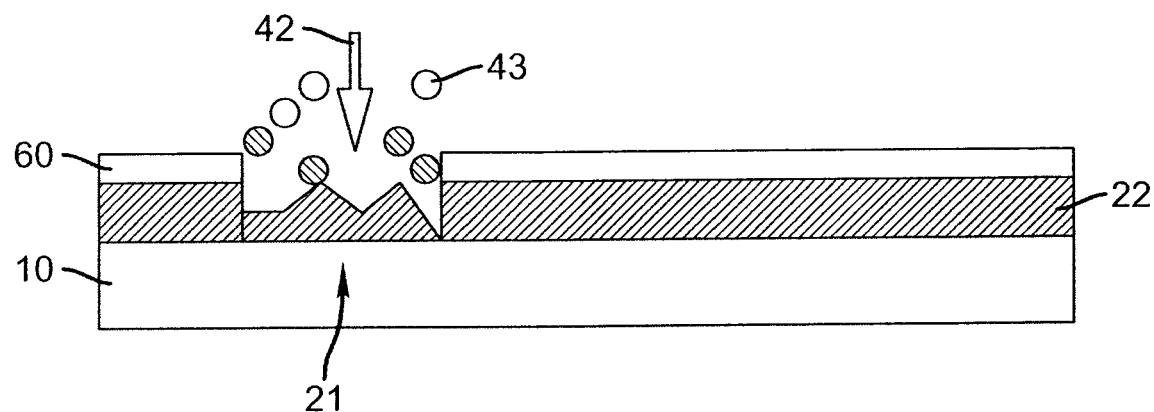
Figure 2C:
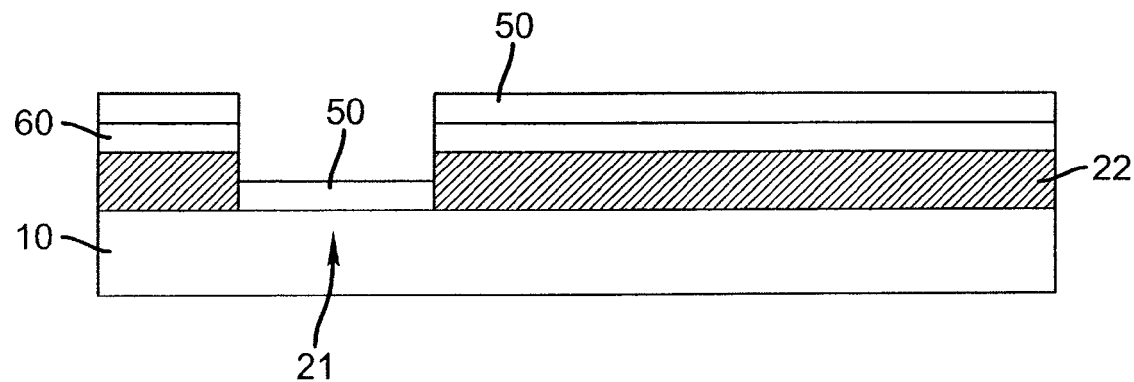
Figure 2D:
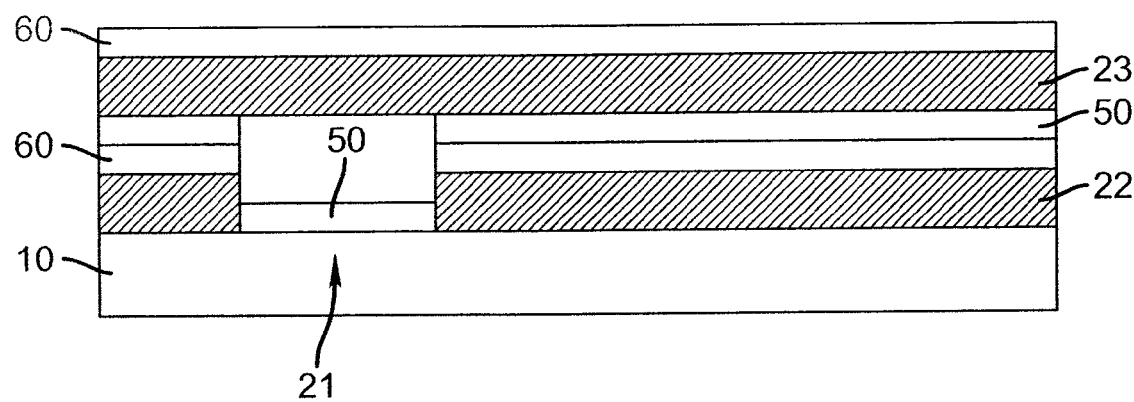
Figure 2E:
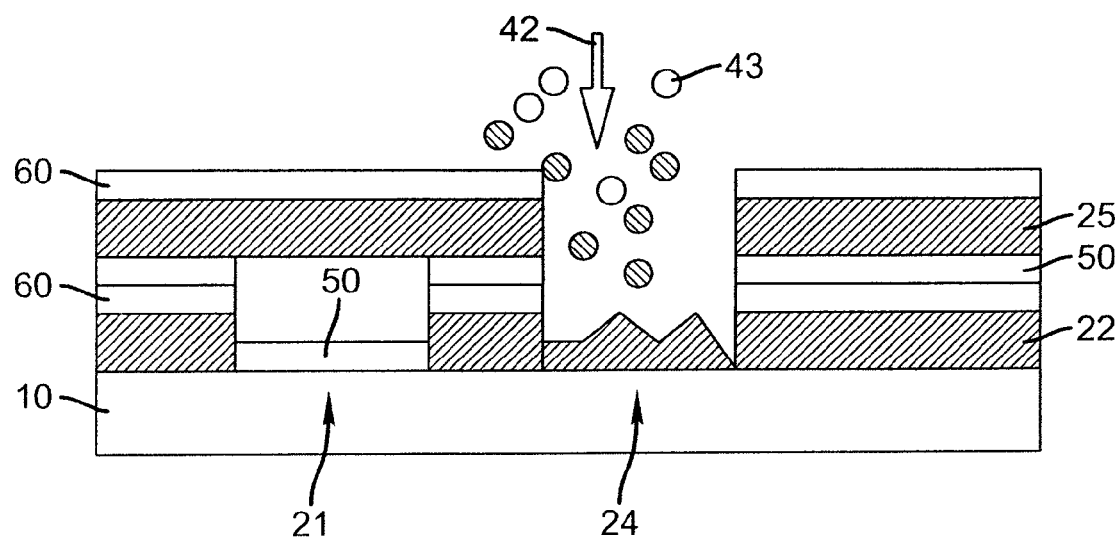
Figure 2F:
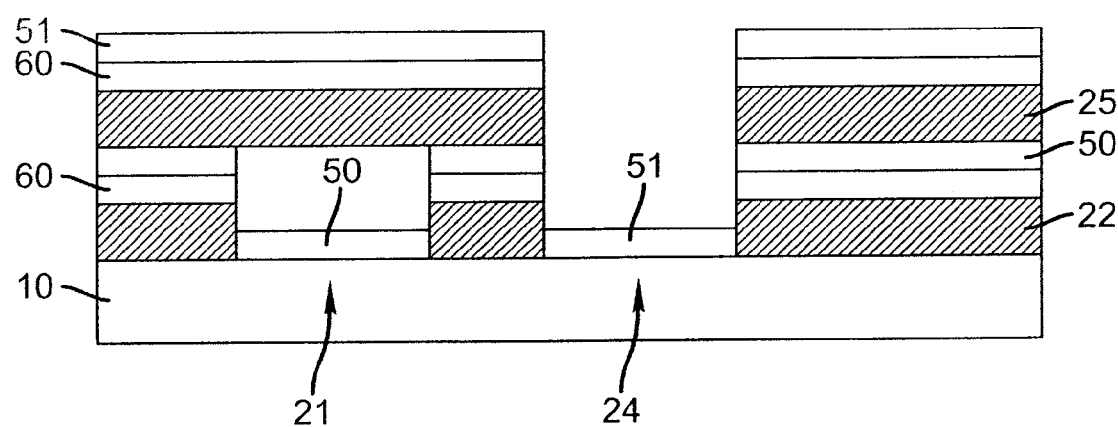
Figure 2G:
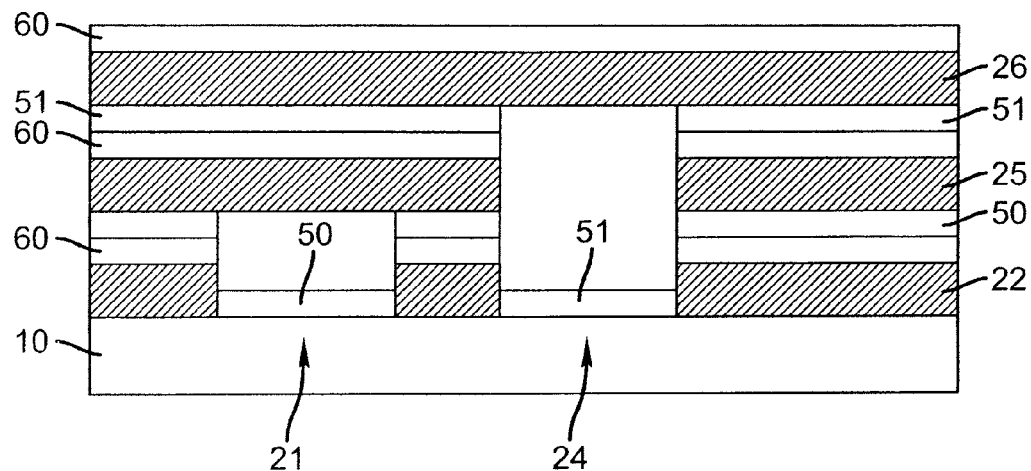
Figure 2H:
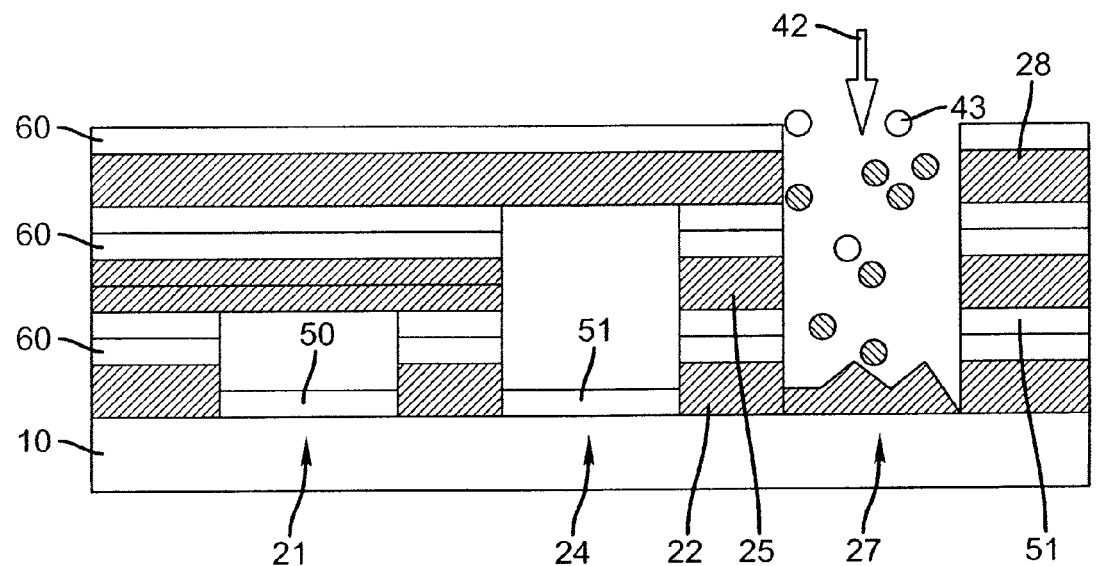

Referring to FIG. 2A, in one embodiment of the present invention, a substrate 10 is provided and a first mask film 20 located over the substrate 10. An adhesive layer 60 is formed over the first mask film 20, either before the first mask film 20 is located over the substrate 10, or after the first mask film 20 is located over the substrate 10. As shown in FIGS. 2A-2K, the adhesive layer 60 is not patterned and may be formed by a variety of means known in the art, for example spraying, roll coating, inkjet deposition, etc. FIG. 2B illustrates the removal of the first opening portion 21 by laser ablation, i.e.; employing a laser beam 42 to vaporize particles 43 and remove them from the first opening portion 21 leaving the first mask portions 22. Particles of the adhesive layer 60 are also removed. Referring to FIG. 2C, first materials 50 are deposited in a layer over first locations over the substrate 10 in first opening portions 21 and over the adhesive layer 60 in the first masking portions 22. As shown in FIG. 2D, the second masking film 23 with adhesive layer 60 is then located over the substrate 10 and first masking portions 22, and second opening portions 24 formed, for example by laser ablation (FIG. 2E) of the second masking film 23 and the first masking portions 22, leaving second masking portions 25. Once the second opening portions 24 are formed, second materials 51 are deposited on second locations over the substrate 10 in the second opening portions 24 (FIG. 2F).

Figure 2I:
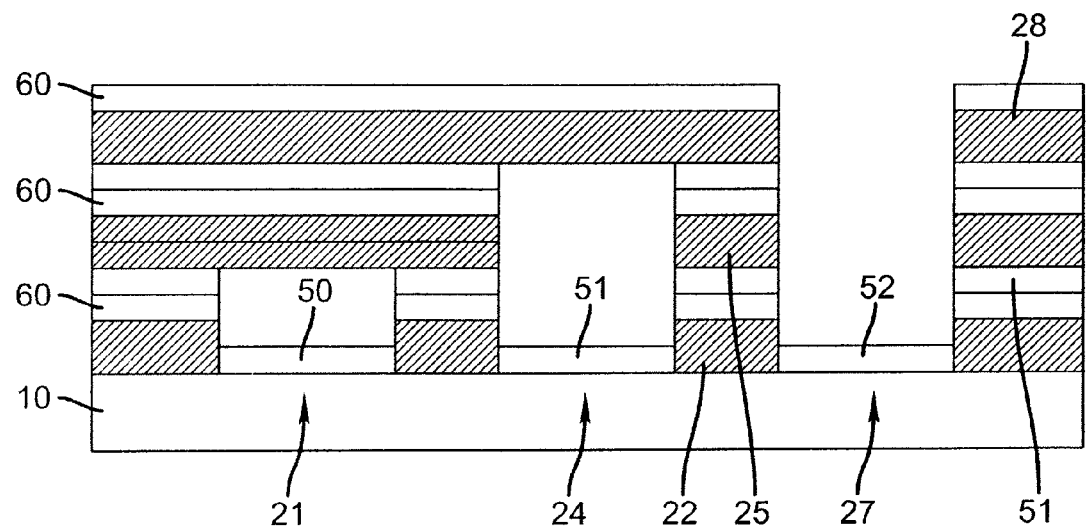
Figure 2J:
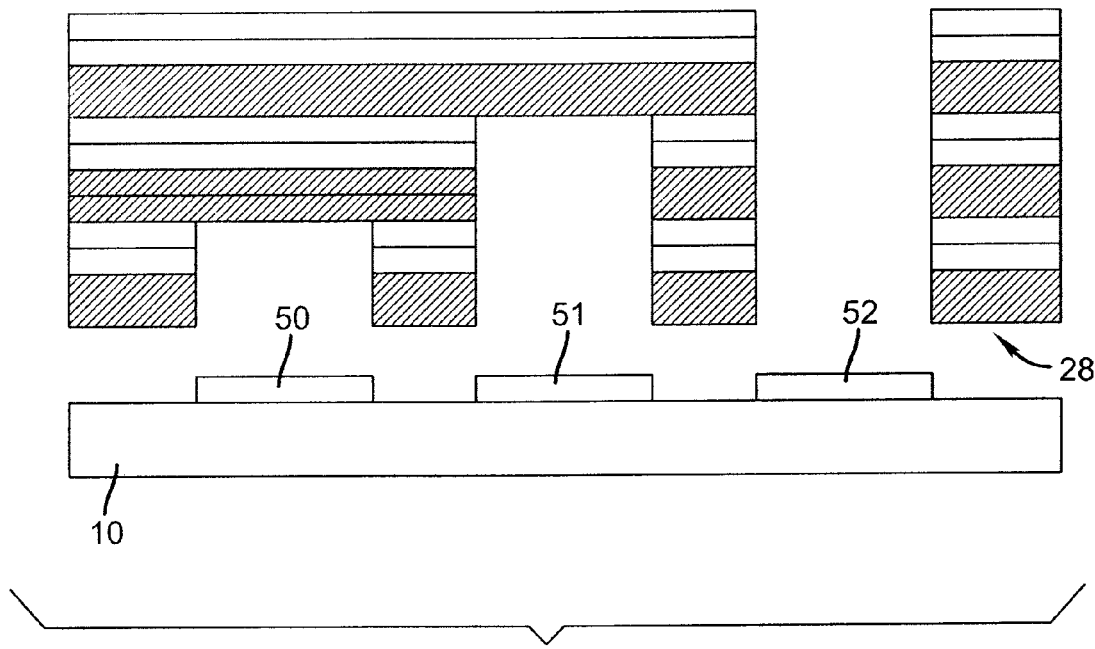

The process of locating a masking film, removing opening portions, and then depositing materials can be repeated. For example, referring to FIG. 2G, a third masking film 26 can be located over the second opening portions 24 and second masking portions 25. Third opening portions 27 are formed in the second masking portions 25 (FIG. 2H) and third materials 52 deposited over the third opening portions 27 and the third masking portions 28 (FIG. 2I). Referring to FIG. 2J, once all of the materials are deposited in the desired locations over the substrate 10, the entire stack of masking film portions can be mechanically removed, leaving behind the substrate and deposited materials.

Figure 3A:
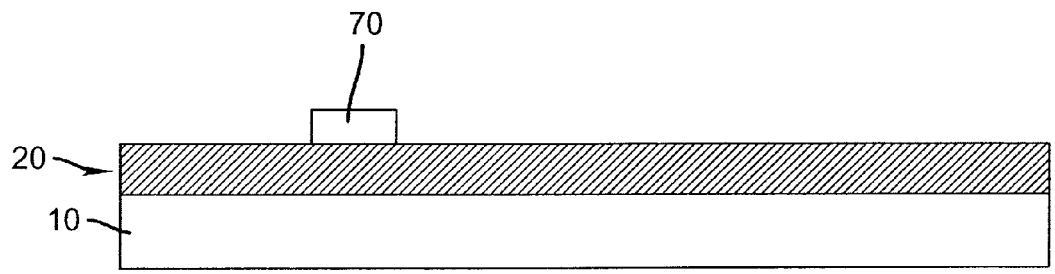
FIGS. 3A-3F are sequential side views of the construction of a patterned substrate according to an alternative embodiment of the present invention.

In an alternative embodiment of the present invention, the opening portions (e.g. 21) are segmented from the masking portions (e.g. 22) of the mask film (e.g. 20) and removed. Referring to FIG. 3A, a first mask film 20 is located over a substrate 10, a patterned adhesive 70 provided (e.g. by inkjet) in the opening areas, and then first opening portions 21 segmented (e.g. by laser ablation) from the first mask portions 22

Figure 3B:
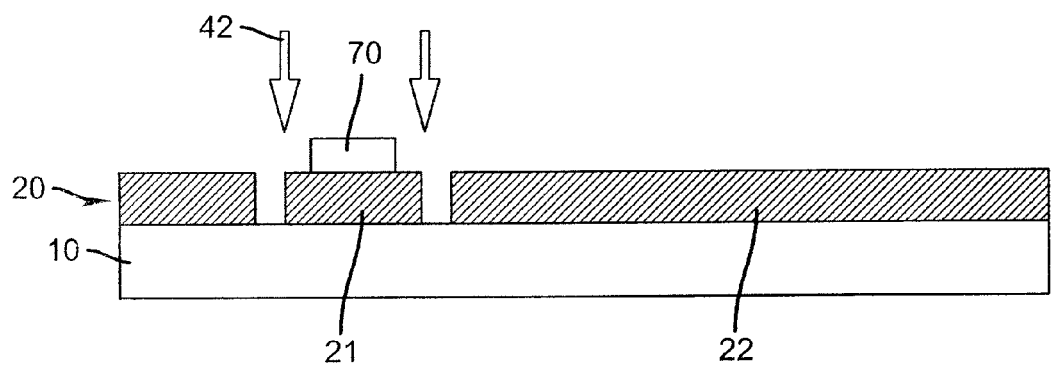
Figure 3C:
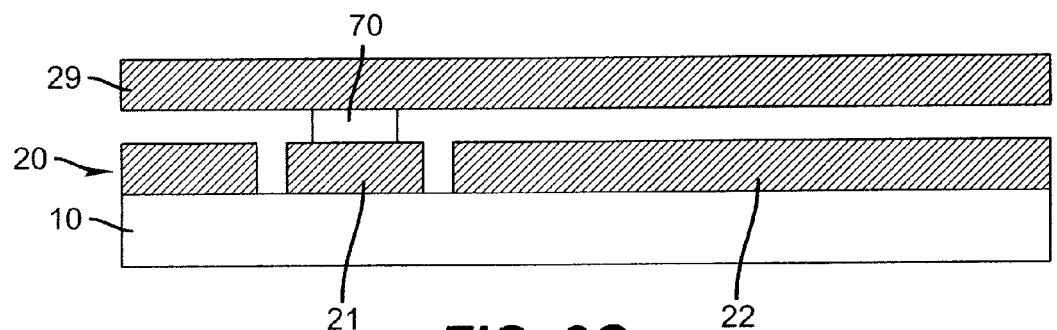
Figure 3D:
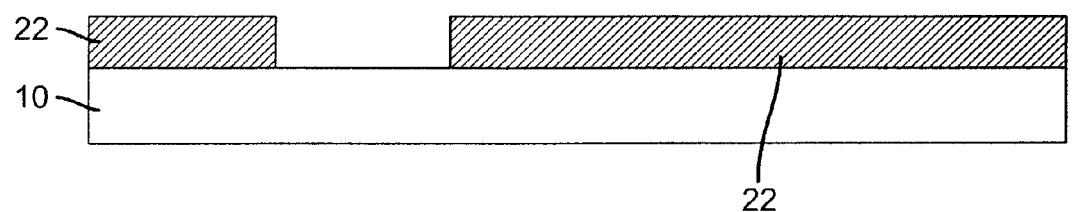
Figure 3E:
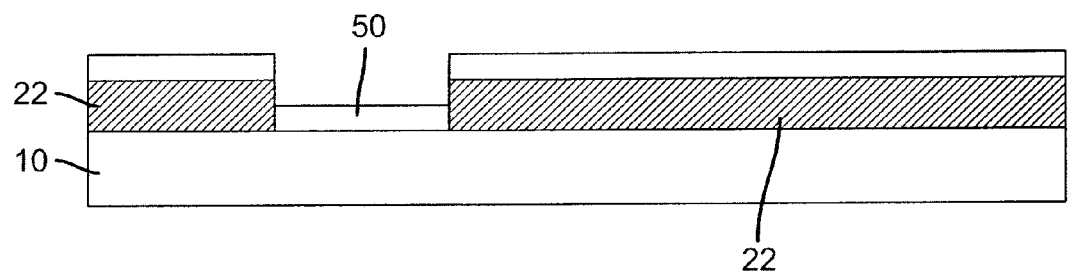
Figure 3F:
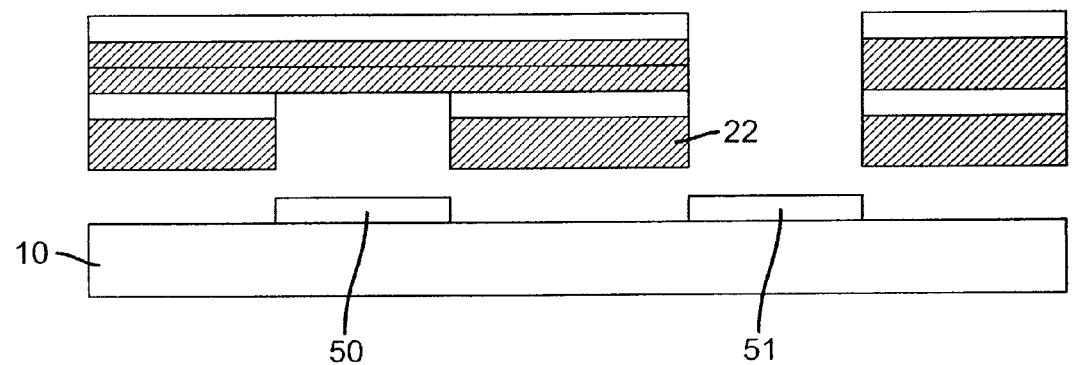

(FIG. 3B) by ablating material around the periphery of the first opening portions 21. A removal film 29 is adhered (FIG. 3C) to the first opening portion 21 with the patterned adhesive 70 and then removed (FIG. 3D) with the first opening portion 21. Referring to FIG. 3E, first materials 50 are deposited over the first mask portions 22 and the first opening portions 21. The process steps shown in FIGS. 3A-3E can be repeated with a second mask film to deposit materials in different locations on the substrate. As shown in FIG. 3F, the masking portions 22 can then be mechanically removed leaving patterned materials 50, 51 on the substrate 10. The adhesive layer can be formed on the first or second masking film before the segmenting step (as shown in FIG. 3A), or wherein the adhesive layer is formed on the first or second masking film after the segmenting step (not shown), or both.

The present invention provides a means to reduce the likelihood of damage to already-deposited materials. For example, the thickness of the mask film may be less than 100 microns or approximately 10 microns, while the size of the opening portions may be 50-300 microns in height or width. Since the second mask film is separated from the substrate by only the thickness of the first mask film and adhesive layer, the second mask film may only be 10-100 microns from the substrate and is therefore likely to actually touch the underlying layers on the substrate in the opening portions. Because the adhesive is located on the side of a masking film opposite the substrate, the subsequent location of a masking film over an opening portion on the substrate having already-deposited materials (e.g. FIGS. 2D and 2G) prevents the adhesive from coming into contact with the deposited materials and is therefore unlikely to damage the deposited materials (50, 51) when the masking portions are mechanically removed. The mask film can also be provided with a chemically inert, very smooth surface (e.g. Teflon) on the side of the film next to the substrate in order to reduce the likelihood of damage to underlying layers in the opening portions.

Figure 20:
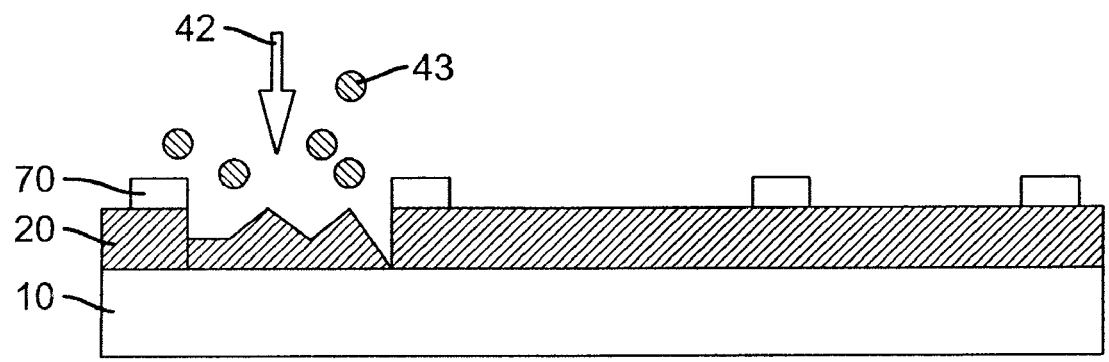
FIG. 20 is a side view of patterned adhesive deposited over a mask film according to an embodiment of the present invention.

While an adhesive is shown in FIGS. 2A-2K, in some embodiments of the present invention such adhesives are not necessary, so long as the mechanical means for locating the masking films over the substrate can provide adequate registration with the substrate and support for removal of the mask film material in the opening portions. Alternatively, in another embodiment of the present invention, the adhesive is patterned between the first and second opening portions. Such patterning may be accomplished by inkjet deposition, screen printing, patterned roll coating, or other means known in the art. As shown in FIGS. 3A-3E, the adhesive may be patterned in the opening portions. Alternatively, referring to FIG. 20, a patterned adhesive 70 may be provided between the various opening portions of the various mask films and no ablation or removal of the patterned adhesive 70 may be necessary. To enhance the adhesion of the second masking film to the first opening portions or first masking portions, the adhesive may be cured or otherwise treated to improve adhesion, for example by heating, exposure to radiation such as ultraviolet light, or provision of mechanical pressure, or other means known in the art. To enhance process stability and to reduce contamination due to the presence of the adhesive, the adhesive may be cured after deposition and before or after the second masking film has been located over the first masking portions and the substrate. The first or second masking films or the adhesive can be light absorbing, or light-absorbing layers can be provided over the substrate to aid absorption of radiation. The adhesive layer can be formed on the first masking film on a side of the first masking film opposite the substrate either before or after the first masking film has been located over the substrate.

Figure 21:
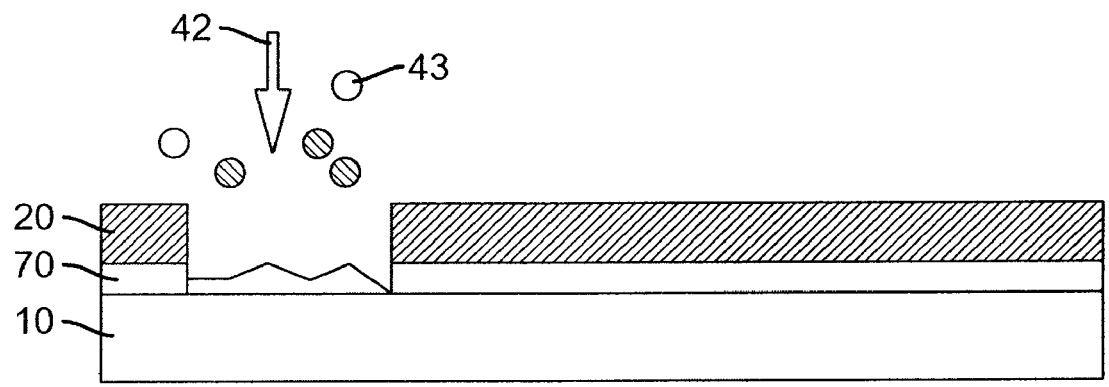
FIG. 21 is a side view of an adhesive deposited over a substrate according to an embodiment of the present invention.

In a further embodiment of the present invention, an adhesive can be provided over the substrate. Referring to FIG. 21, in one method of the present invention, the adhesive may be coated over the entire substrate area and removed with the opening portions of the mask films, for example, by ablation or by cleaning steps undertaken after the opening portions are removed. Alternatively, an adhesive can be patterned on the substrate between the locations in which the materials are deposited, thereby keeping the deposition areas clean (not shown). In yet another alternative, an adhesive can be provided on a side of the first mask film next to the substrate. If this adhesive is not patterned, it may be removed with the opening portions, for example by laser ablation or chemical means. If the adhesive is patterned, it may be patterned in the masking portions between the opening portions of the various mask films, thereby keeping the deposition areas clean. The adhesive can be deposited on either the substrate or the first mask film by inkjet, coating, or spraying means known in the art, and can be formed on the substrate before the first mask film is located over the substrate, or formed on the first mask film before the first mask film is located over the substrate.

The first and second patterned areas can be spatially separated over the substrate and raised areas of the substrate can be formed between the first and second patterned areas. Such raised areas can reduce the contact of the mask films with the deposited materials.

Figure 6:
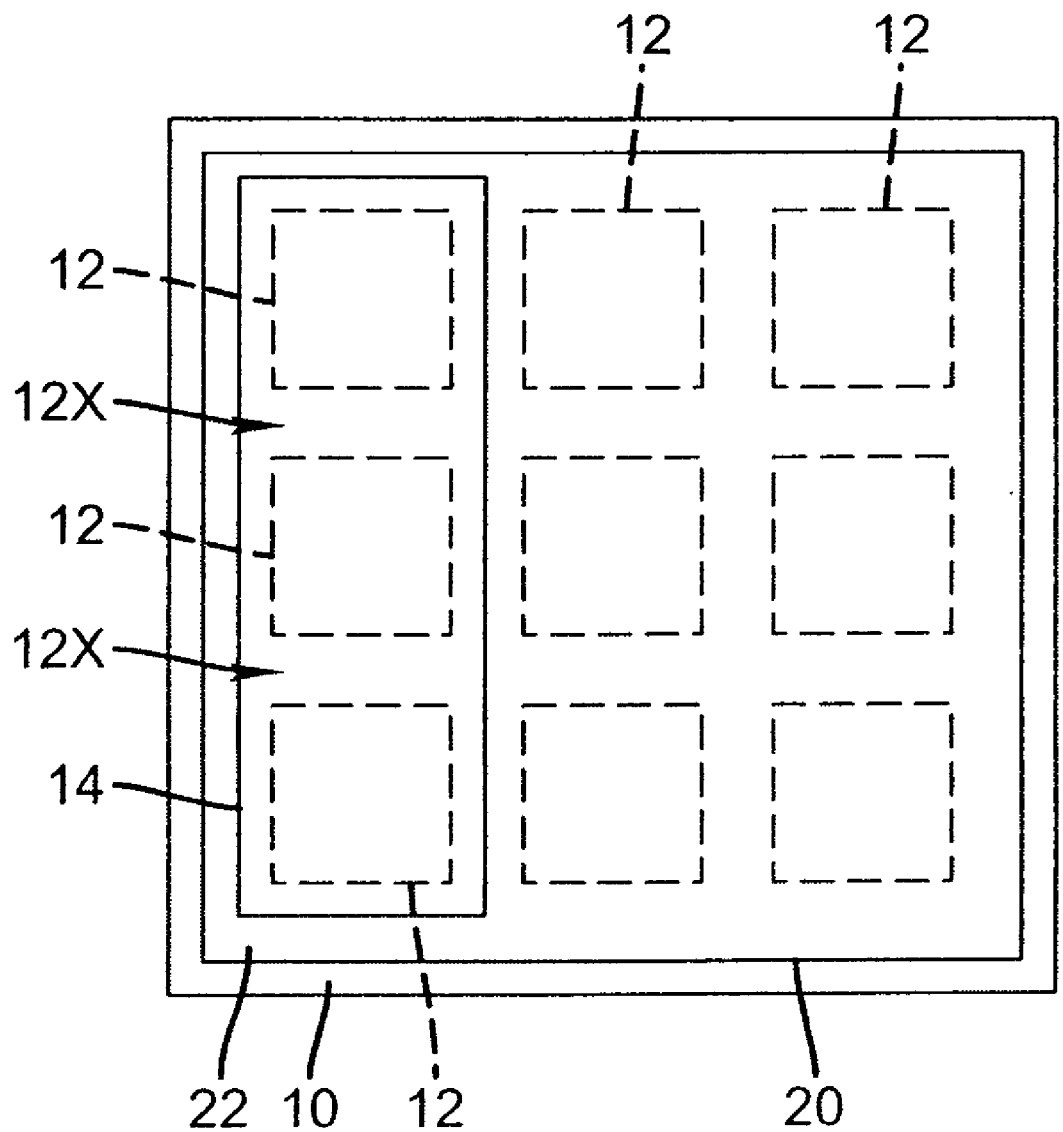
FIG. 6 is a top view of areas over a substrate according to an embodiment of the present invention.

The present invention can be employed to pattern a substrate and form distinct operable areas, for example, light-emitting pixels in a display. The materials may be light-emitting materials. For example, organic materials such as small-molecule or polymer materials, or inorganic materials such as phosphorescent materials or quantum dots can be used as light-emitting materials. Such operable areas are operable to emit light and are separated by inoperable areas that do not emit light. Referring to FIG. 6, for example, display devices typically have a plurality of light-emitting elements having light-emitting areas 12 located over different locations on a substrate 10. An opening portion 14 in a masking film 20, according to an embodiment of the present invention, is an opening in the masking film 20 that covers at least two different operable, light-emitting areas 12 separated by inoperable non-light emitting areas 12X. The remainder of the masking film 20 comprises the masking portion 22 of the masking film 20. Since the light-emitting areas 12 are typically not themselves contiguous, the contiguous opening portions 14 will typically also cover a portion 12X of the substrate 10 that is not light-emitting.

The masking films 20 employed in multiple different deposition steps may be identical. However, in most embodiments of the present invention, the opening portions 14 in the masking film 20 are formed in different locations so that different materials and elements may be deposited in different locations over the substrate 10. Moreover, more than one material can be deposited through the contiguous opening portions, as may other materials deposited in layers over the same location on the substrate 10. For example, the materials may comprise a plurality of light-emitting materials in light-emitting layers. The light-emitting materials can be organic materials comprising a small-molecule or polymer molecule light-emitting diodes. Alternatively, the light-emitting materials can be inorganic and comprise, for example, quantum dots. Other layers may comprise charge-control layers such as, for example, hole-injection, hole-transport, hole-blocking, electron-injection, electron-blocking, and electron-transport layers, as well as buffer layers and thin, high-resistance layers. Optically active materials, for example, light-scattering materials can also be deposited.

According to various embodiments of the present invention, the opening portions of the mask film allow the deposition of materials into the exposed locations. At the same time, the masking portions of the mask film protect the remainder of the area over the substrate from undesirable deposition and particulate contamination caused by the subsequent ablation or segmenting of the masking film. Deposition of material into the exposed locations includes evaporating, inkjet, spray coating, slide coating, hopper coating, or curtain coating materials over the substrate in the exposed locations.

Figure 4:
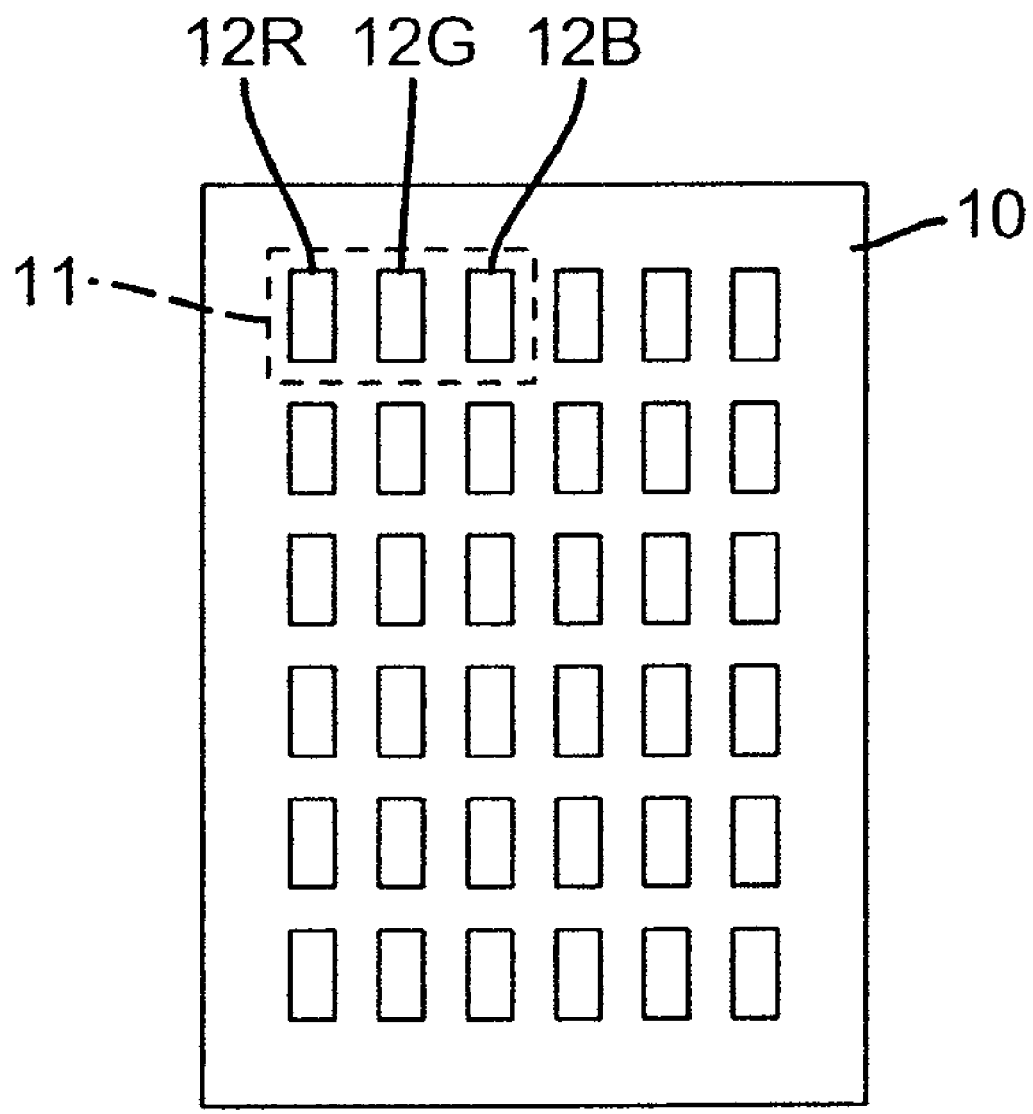
FIG. 4 is a top view of a three-color pixel stripe layout on a substrate according to the prior art.

Referring to FIG. 4, in a prior-art design, pixels 11 comprise three, patterned, light-emitting areas 12R, 12G, 12B, each patterned light-emitting area 12 comprising a sub-pixel emitting light of a different color, for example red, green, and blue, to form a full-color display. In other designs, four-color pixels are employed, including a fourth white, yellow, or cyan light-emitting area. The present invention includes any patterned light-emitting device.

As shown in FIG. 4, the light-emitting elements 12R, 12G, 12B are arranged in a stripe configuration such that each color of light-emitting area forms a column of light-emitting areas emitting the same color of light. Alternatively, four-element pixels can be arranged in two-by-two groups of four light-emitting elements (not shown). All of these different designs and layouts can be formed by the method of the present invention, regardless of design, layout, or number of light-emitting areas per pixel or colors of light-emitting areas and specifically includes displays having red, green, and blue sub-pixels and displays having red, green, blue, and white sub-pixels.

As taught in the prior art, for example, in manufacturing light-emitting devices, deposition masks may be made of metal and are reused multiple times for depositing evaporated organic materials. The masks may be cleaned but are, in any event, expensive, subject to thermal expansion, difficult to align, damage pre-deposited organic materials, and are problematic to clean. Moreover, the masks eventually wear out.

The present invention does not employ photolithographic methods of liquid coating, drying, patterned exposure forming cured and uncured areas, followed by a liquid chemical removal of the cured or uncured areas to form a pattern. In contrast, the present invention provides a very low-cost, single-use mask that is patterned while in place over the substrate, thereby overcoming the limitations of the prior art. The masks themselves may be formed of flexible thin films of, for example, polymers, either transparent or non-transparent and may be patterned in a completely dry environment, that is, no liquid chemicals are employed.

Figure 5C:
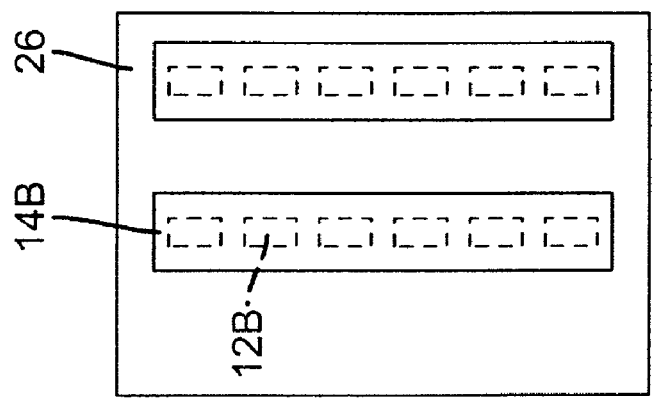
FIGS. 5A-C are top views of three different mask films with openings for depositing different materials on a substrate useful for the present invention.
Figure 5B:
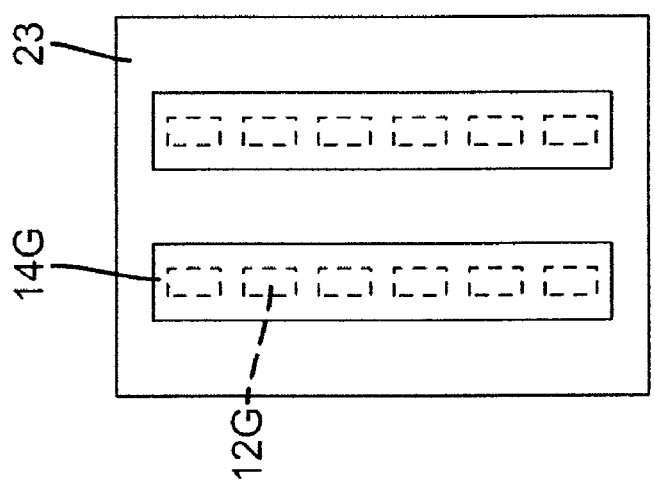
Figure 5A:
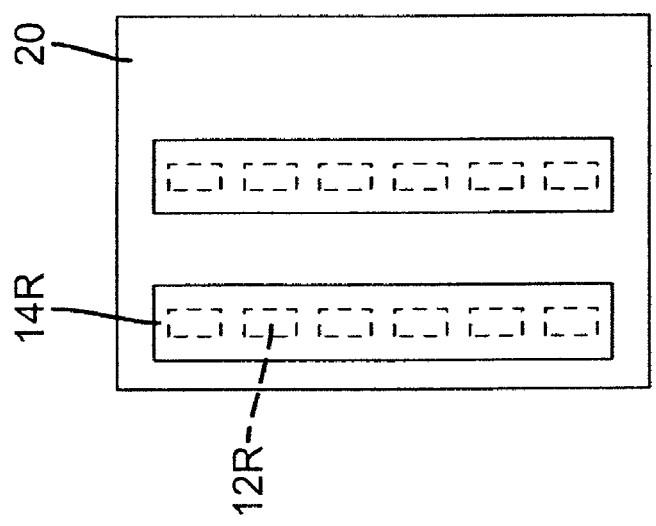

The deposited material 50, 51, 52 are light-emitting materials that emit light of different colors in response to a current provided, for example by passive- or active-matrix circuitry as is known in the flat-panel display art. The circuitry may be employed to form patterned light-emitting areas over which the light-emitting materials are pattern-wise deposited. The pattern of mask holes 14R, 14G, 14B in the first, second, and third mask films 20, 23, 26 can be different (as shown in FIGS. 5A-5C) to expose different patterned, light-emitting areas and different light-emitting materials that are deposited in the different areas. Mask holes 14 correspond to opening portions in a mask. Hence, three different materials may be patterned in three different sets of light-emitting area locations (e.g. 12R, 12G, and 12B in FIGS. 4 and 5) over the substrate to form a plurality of full-color light-emitting pixels. Any remaining processing steps necessary to form a complete device may then be performed. For example, an OLED device using patterned OLED materials can be employed in either a top- or bottom-emitter configuration. Note that the present invention may be combined with the unpatterned deposition of other layers to form a complete light-emitting device. Such unpatterned materials may include charge-injection layers and charge-transport layers, for example as are known in the organic and inorganic LED arts. Alternatively, all of the layers can be patterned. Moreover, for some embodiments, the areas of the mask holes 14 may be larger than the light-emitting areas 12 (as shown in FIGS. 4, 5, and 6). Since the light-emitting areas 12 are typically defined by patterned device electrodes (not shown), it is only necessary to deposit material over the electrode areas corresponding to light-emitting elements 12. Additional material is deposited elsewhere to ensure that deposition tolerances are maintained.

Figure 7:
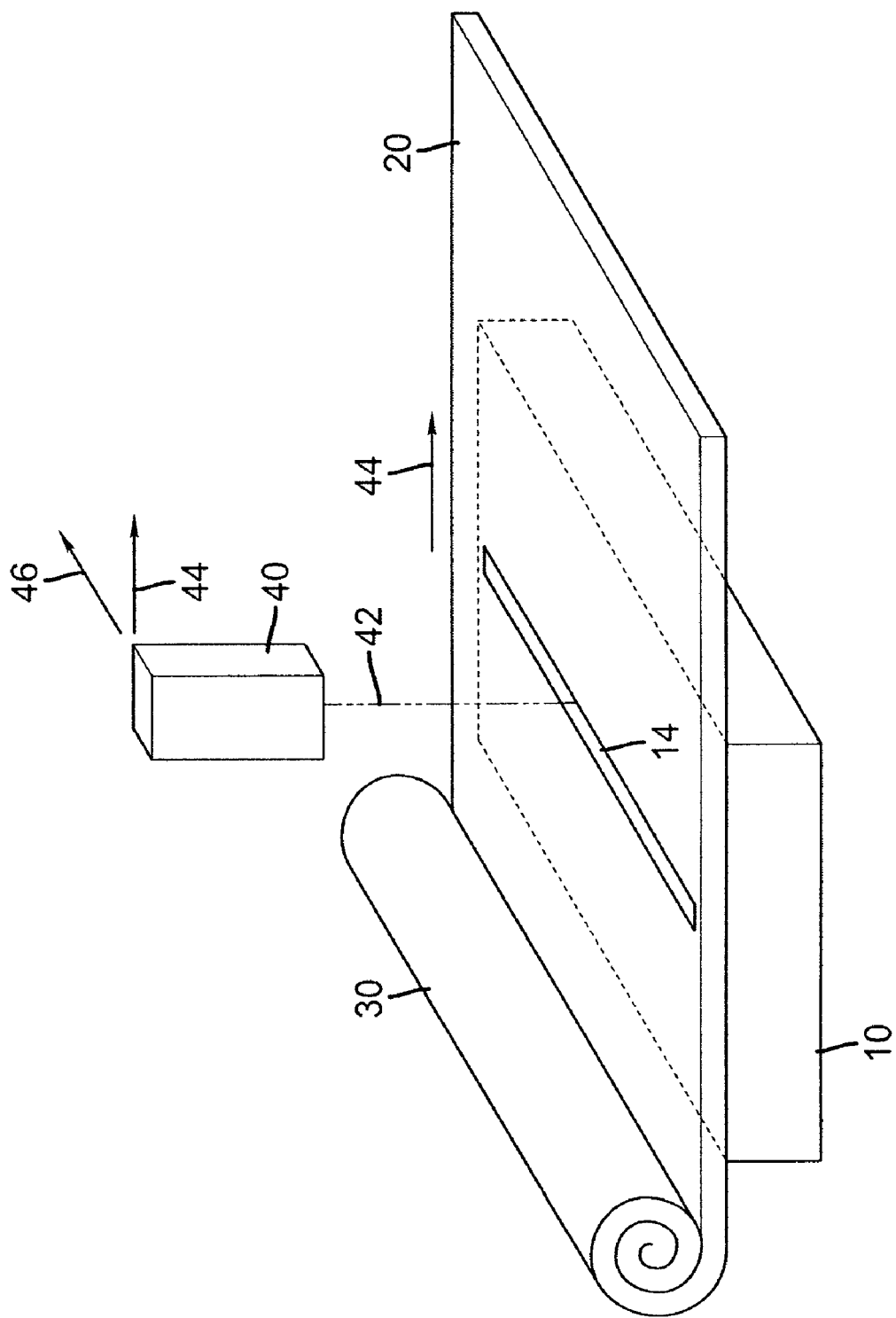
FIG. 7 is a perspective of a mask-film roll, mask film, material ablation device, and substrate useful for the present invention.
Figure 8:
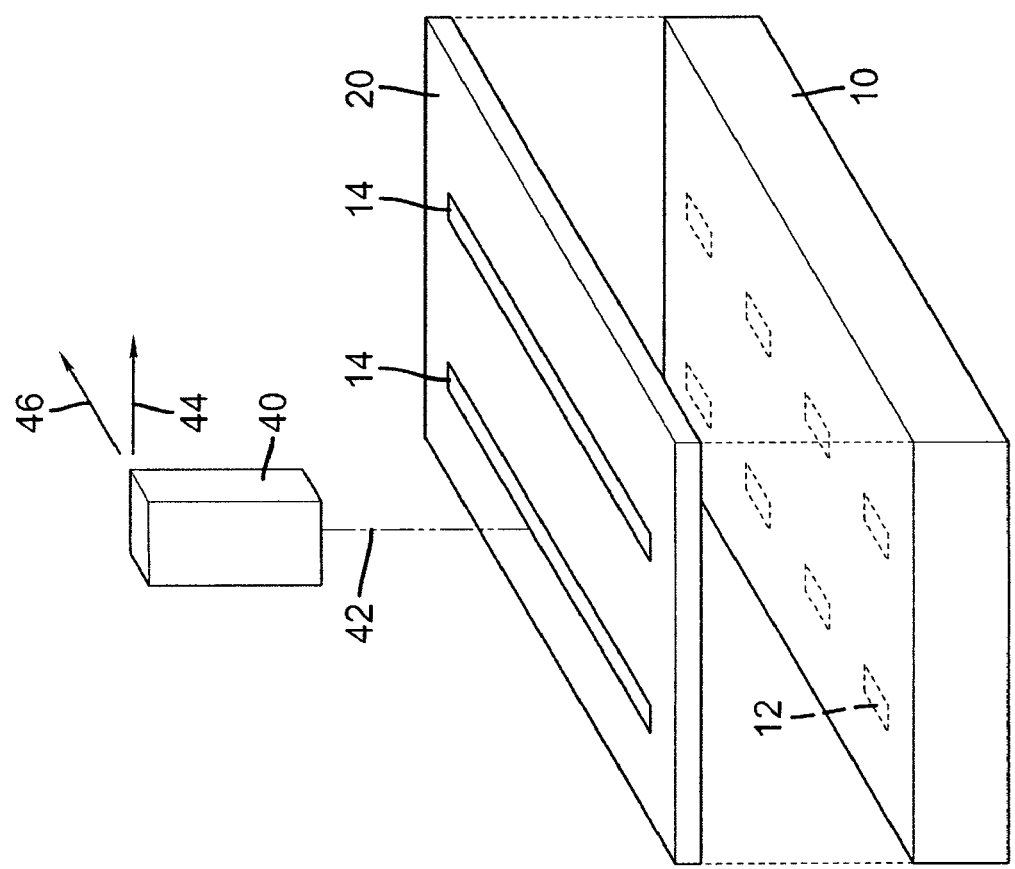
FIG. 8 is an exploded perspective of a mask film, material ablation device, and substrate useful for the present invention.

As described above, the opening portions (e.g. 21) corresponding to mask holes 14 can be segmented from the masking film by removing the mask-film material from the perimeter of the openings in the masking film. This may be done by heating the masking film material, for example, by laser ablation, or by chemically treating the masking film. Referring to FIG. 7, a laser 40 emitting a beam of laser light 42 ablates the mask film 20 material in the perimeter of the mask hole openings 14 in masking film 20 over substrate 10. The beam of laser light 42 (or laser 40) is moved in orthogonal directions 44 and 46 to scan across the perimeter of the mask hole 14 and thereby ablate the material from the perimeter of mask hole 14. The mask hole 14 corresponds to the opening portions in the mask films (e.g. 21, 24, 27). Alternatively, the substrate 10 may be moved in one direction while the beam of laser light 42 scans in the orthogonal direction, thereby enabling a continuous process. In another alternative described above, the laser 40 is employed to ablate the material in the mask hole 14. The masking film 20 can be dispensed from a roll 30 of masking film material and located over the substrate 10. Likewise, when the masking film 20 is removed, the mask film material may be mechanically picked up on a second roller (not shown) as new masking film material is advanced from the roller 30. Rolls of films, mechanisms for moving and locating the films over a substrate, lasers, and mechanisms for scanning lasers over a surface are all known in the art. FIG. 8 illustrates a more detailed exploded view including the laser 40, beam of laser light 42, the scan directions 44 and 46, the masking film 20 over the substrate 10, and a plurality of mask holes 14 located over light-emitting elements 12.

While the masking film 20 need not itself be registered with the light-emitting areas 12 on the substrate 10, the mask hole openings 14 may correspond with the patterned, light emitting areas 12 and also be registered with them. Such registration is aided by providing, for example, fiducial marks on the substrate. Such marks and the mechanisms for scanning lasers and ablating material to a necessary tolerance are known in the art, as are devices for collecting ablated material. Typical light-emitting areas 12 are, for example, 40 microns by 100 microns in size.

Figure 9:
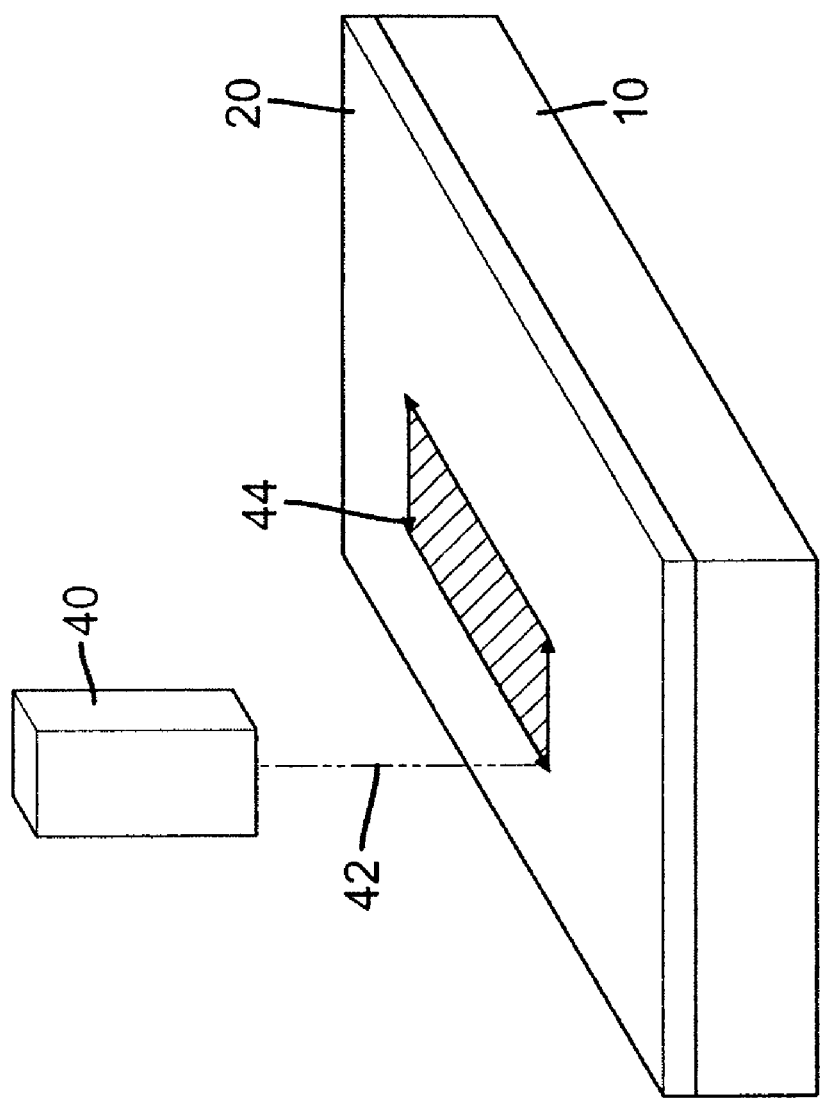
FIG. 9 is a perspective of a patterned mask film, material ablation device, and substrate useful for the present invention.
Figure 10:
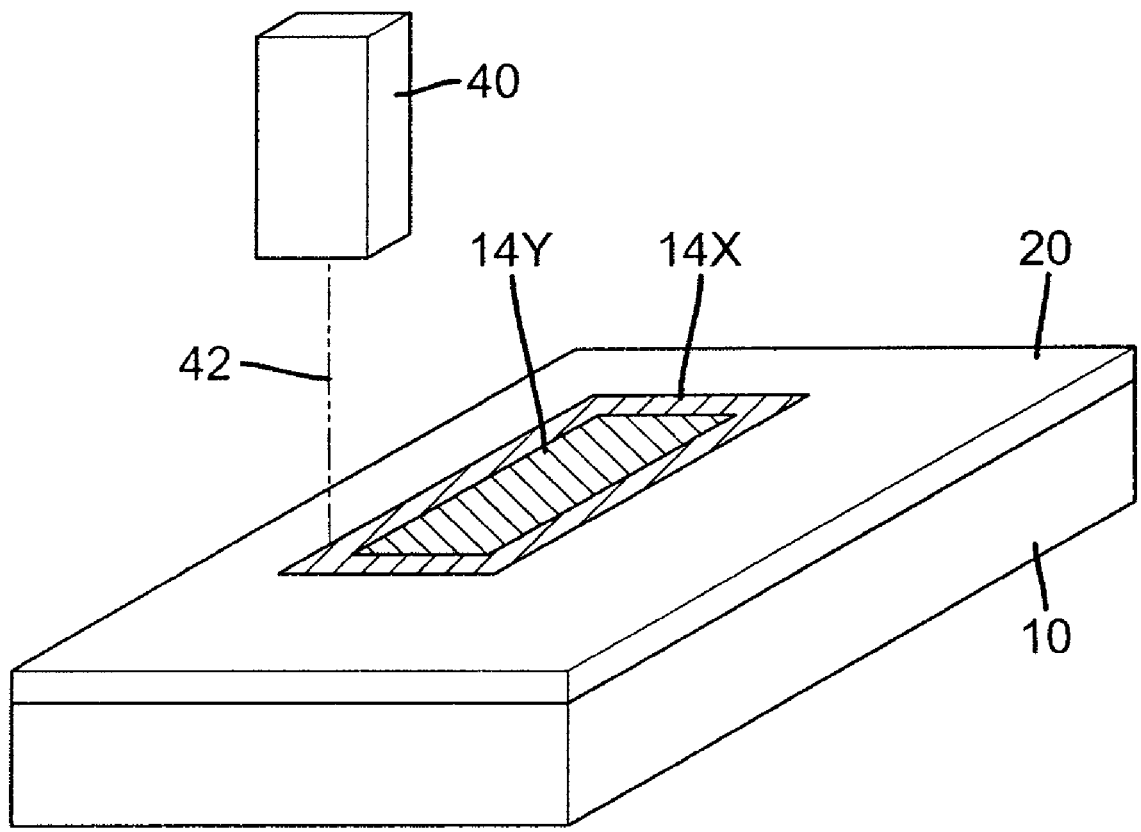
FIG. 10 is a perspective of a patterned mask film having an opening portion with a perimeter, a material deposition device, and substrate useful for the present invention.

In more detailed illustrations, referring to FIGS. 9 and 10, the laser 40 scans a beam of laser light 42 around the perimeter 14X of the mask hole 14Y so that the masking film material in the interior of the mask hole 14Y is mechanically detached from the masking film 20. The segmented masking film material 14Y within the perimeter 14X is mechanically removed, thereby leaving the mask hole opening 14Y free for subsequent deposition of light-emitting material. Alternatively, the laser 40 scans the entire surface of the mask hole 14 with laser light 42 to ablate all of the material in the mask hole 14.

Figure 11:
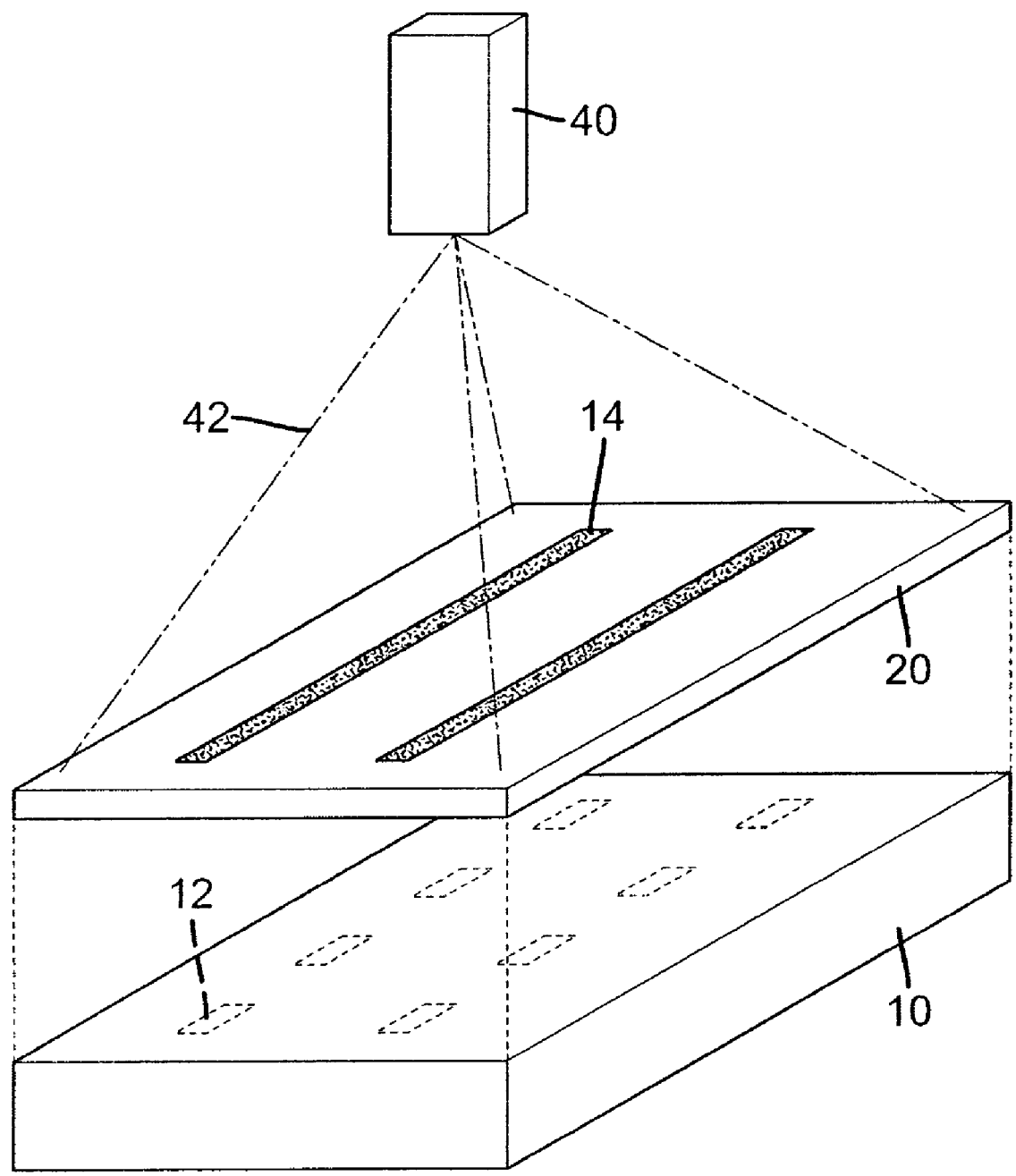
FIG. 11 is an exploded perspective of a patterned mask film, material ablation device, and substrate useful for the present invention.

While FIGS. 9 and 10 illustrate embodiments in which a beam of laser light 42 is moved over the masking film 20 to form mask hole openings 14, FIG. 11 illustrates an alternative approach. Referring to FIG. 11, the masking film 20 includes light absorptive areas adapted to selectively absorb laser light so that ablation only occurs in the light-absorptive areas. Light-absorptive areas, in the locations of the mask hole openings 14 or the perimeter thereof (as shown), may be formed by printing light-absorbing materials on the masking film 20, for example, by inkjet or gravure processes, before or after the masking film 20 is located over the substrate 10. The light-absorptive areas correspond to the perimeter of masking holes 14. In this way, the entire masking film 20 (or portions thereof) is exposed at one time to ablate material in the light-absorptive areas, thereby increasing the amount of material that may be ablated in a time period and decreasing the amount of time necessary to form the mask hole openings 14 in the masking film 20.

Figure 12:
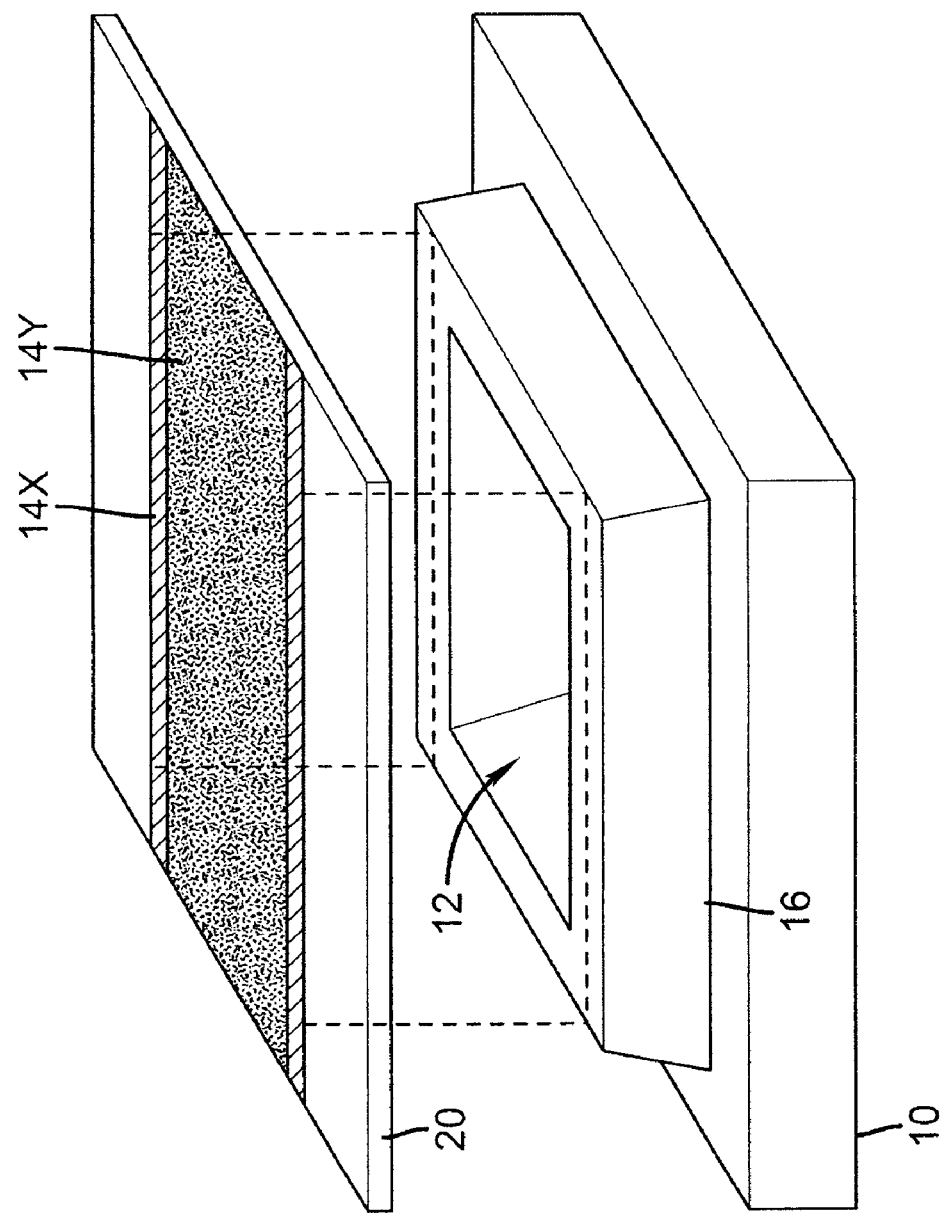
FIG. 12 is a three-dimensional view of a patterned mask film and a substrate with a raised area useful for the present invention.

Referring to FIG. 12, in a further embodiment of the present invention, raised areas 16 are formed over the substrate 10. The raised areas 16 typically do not emit light and are inoperable. Such raised areas 16 can comprise, for example, photolithographic materials such as photo-resist or silicon dioxides or silicon nitrides formed on the substrate 10 through photolithographic processes and can be, for example, 20 microns to 50 microns wide, depending on the tolerances of the processes used to pattern the substrate electrodes or thin-film electronic components formed on the substrate. The raised areas 16 are located around a patterned, light-emitting area 12 and are employed to insulate electrodes formed over the substrate 10. Such processes are well known in the photolithographic art and have been employed in, for example, OLED devices. The masking film 20 is located over the substrate 10 and in contact with the raised areas 16. Laser ablation is performed to detach the mask hole material by ablating masking film material in a portion of the perimeter 14X of the mask hole 14. The remaining masking film material 14Y corresponding to the contiguous opening portion 14 is then detached. By employing a raised area 16, the masking film 20 is prevented from contacting the substrate 16 and any pre-existing layers located in the light-emitting areas 12.

As shown in FIG. 12, the mask hole perimeter 14X is located entirely or at least in part over the raised areas 16 (as shown by the dashed lines). In this embodiment, the beam of laser light 42 is not directed into the light-emitting element area 12, thereby avoiding any problems that might result from exposing existing layers of material that are already present in the light-emitting areas 12 (for example, inadvertent ablation of pre-deposited organic materials). Note that the area of the mask hole 14 is larger than the light-emitting area 12. The illustrations of FIG. 12 shows the substrate 10 below the masking film 20, however, the positions of the substrate 10 and masking film 20 can be reversed, so that detached materials may fall away from the masking film 20 to aid any mechanical removal.

Figure 13:
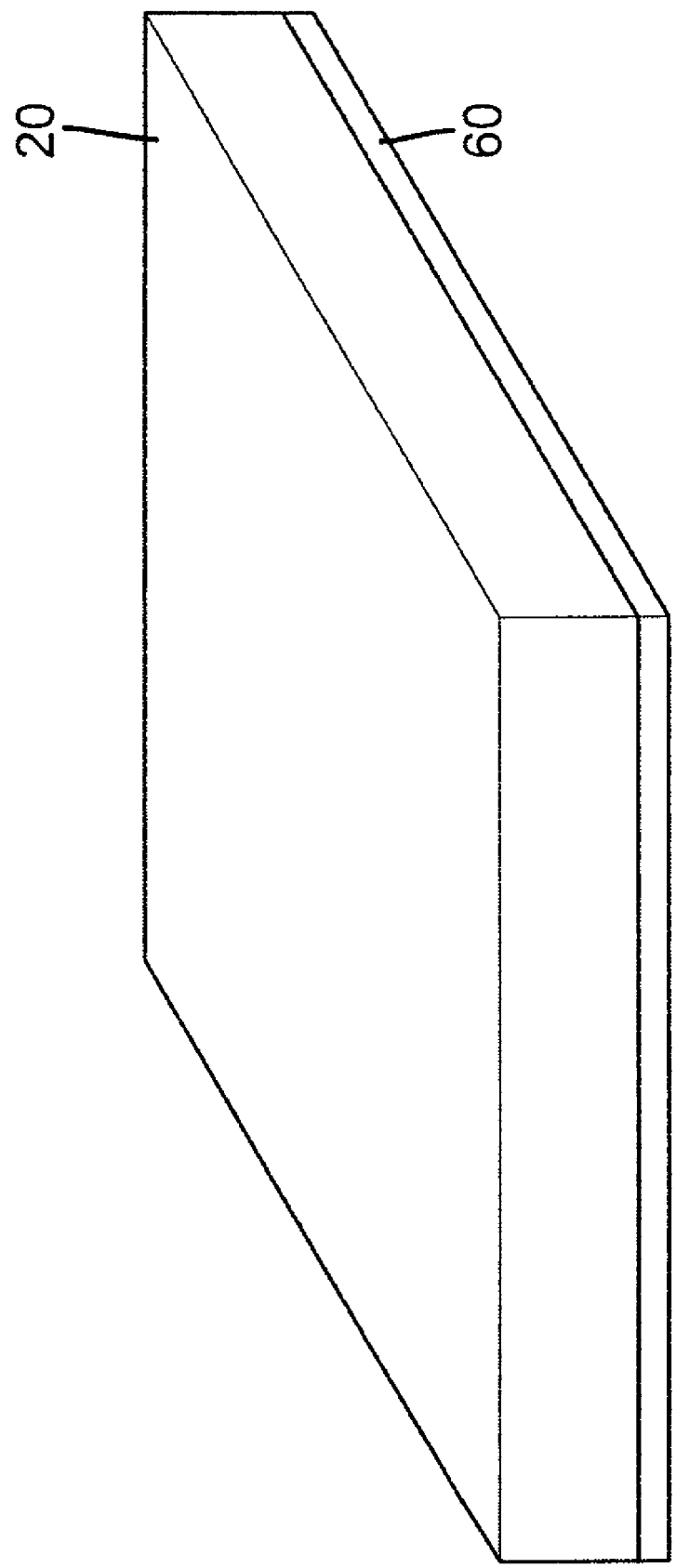
FIG. 13 is a three-dimensional view of a mask film having an adhesive layer useful for the present invention.

In further embodiments of the present invention as shown in FIG. 13, the masking film 20 is coated with an adhesive 60 on one or both sides of the masking film 20 to assist in locating and maintaining the masking film 20 in registration with other masking films, the substrate 10, and light-emitting areas 12. The adhesive can be located on the side of the masking film 20 that it is in contact with, and adjacent to, the substrate 10 or raised areas 16, or around the perimeter 14X of a mask hole 14 to reduce possible contamination in the mask holes 14 and to reduce the need for ablating the adhesive. A relatively weak adhesive is preferred, for example, an adhesive strong enough to maintain registration between mask films or between the mask films and the substrate, but weak enough to be mechanically removed from the substrate without damage to the substrate, mask films, or causing particulate contamination. The adhesive prevents the masking film 20 from moving with respect to the substrate 10 and also serves to prevent detached masking film material from moving or falling into the light-emitting area 12, or aid in mechanical removal, thus improving the mask film removal process. In another embodiment of the present invention, the adhesive is not activated when the mask film 20 is applied over the raised areas 16. Pressure supplied from, for example a roller or plate, is employed to adhere the mask film 20 to the raised areas 16. In an alternative embodiment, the adhesive can be pattern-wise light- or heat-curable, and light or heat is applied to the portions of the mask film in contact with the raised areas 20. Patterned adhesive has the advantage of reducing undesirable or inadvertent adhesion to other layers coated on the substrate, for example, the light-emitting materials.

Figure 14:
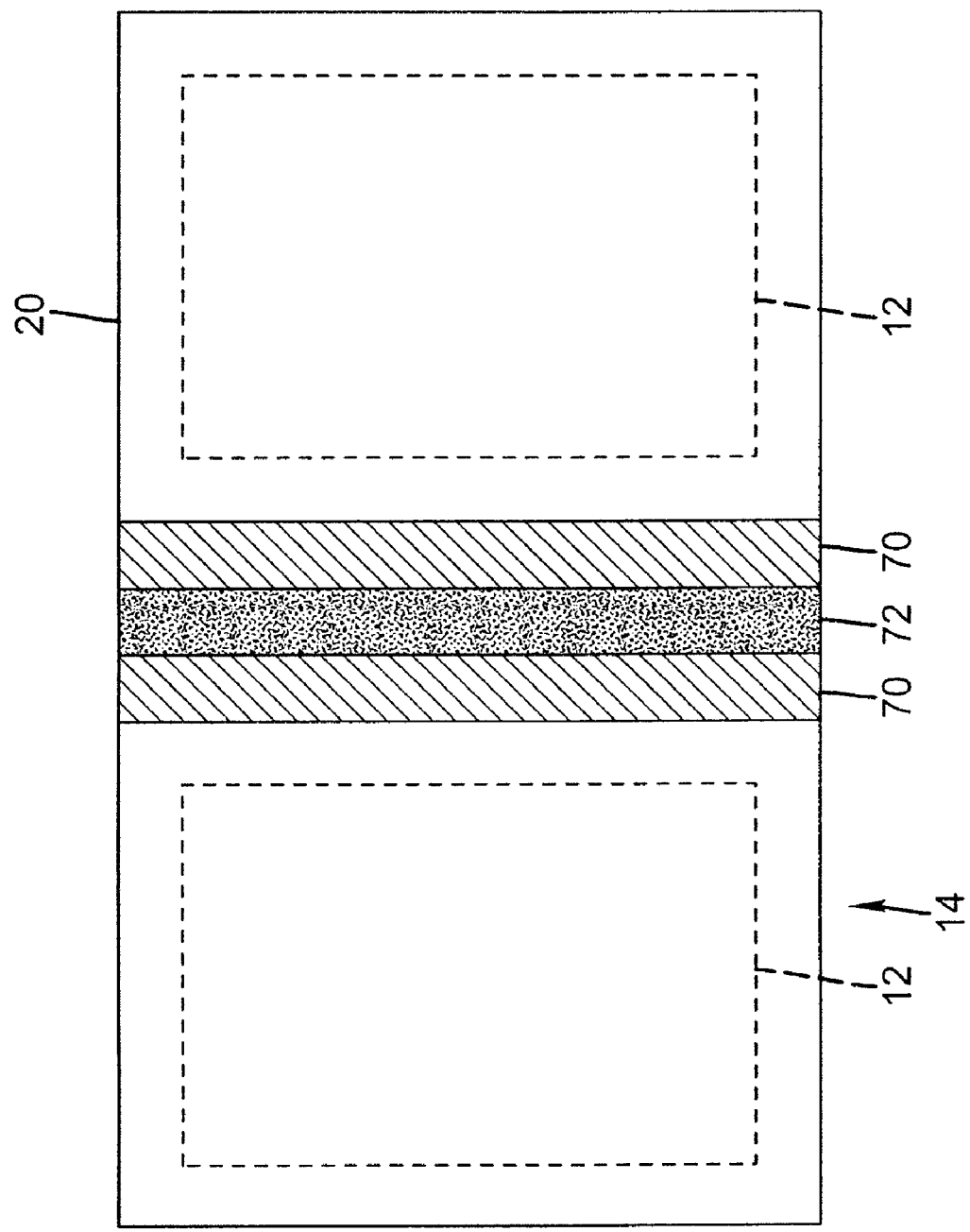
FIG. 14 is a top view of a light-emitting element, patterned adhesive area, and exposure path useful for the present invention.

In a further embodiment of the present invention, a pattern-wise-adhesive layer is formed in an area slightly larger than, and in registration with, the perimeter of the mask holes 14, so that the material at the edge of the holes adheres to the raised areas 16, substrate 10, or layers coated on the substrate 10. Referring to FIG. 14, two adjacent patterned, light-emitting areas 12 are covered with mask film 20. Portions 70 of the mask film 20 are coated with adhesive to enable adhesion to the underlying surface between the patterned, light-emitting areas 12. The portion of the mask film material in a channel 72 is removed, for example, by ablation, so that the masking portion 22 of the mask film 20 can be segmented from the opening portion 14.

Figure 15:
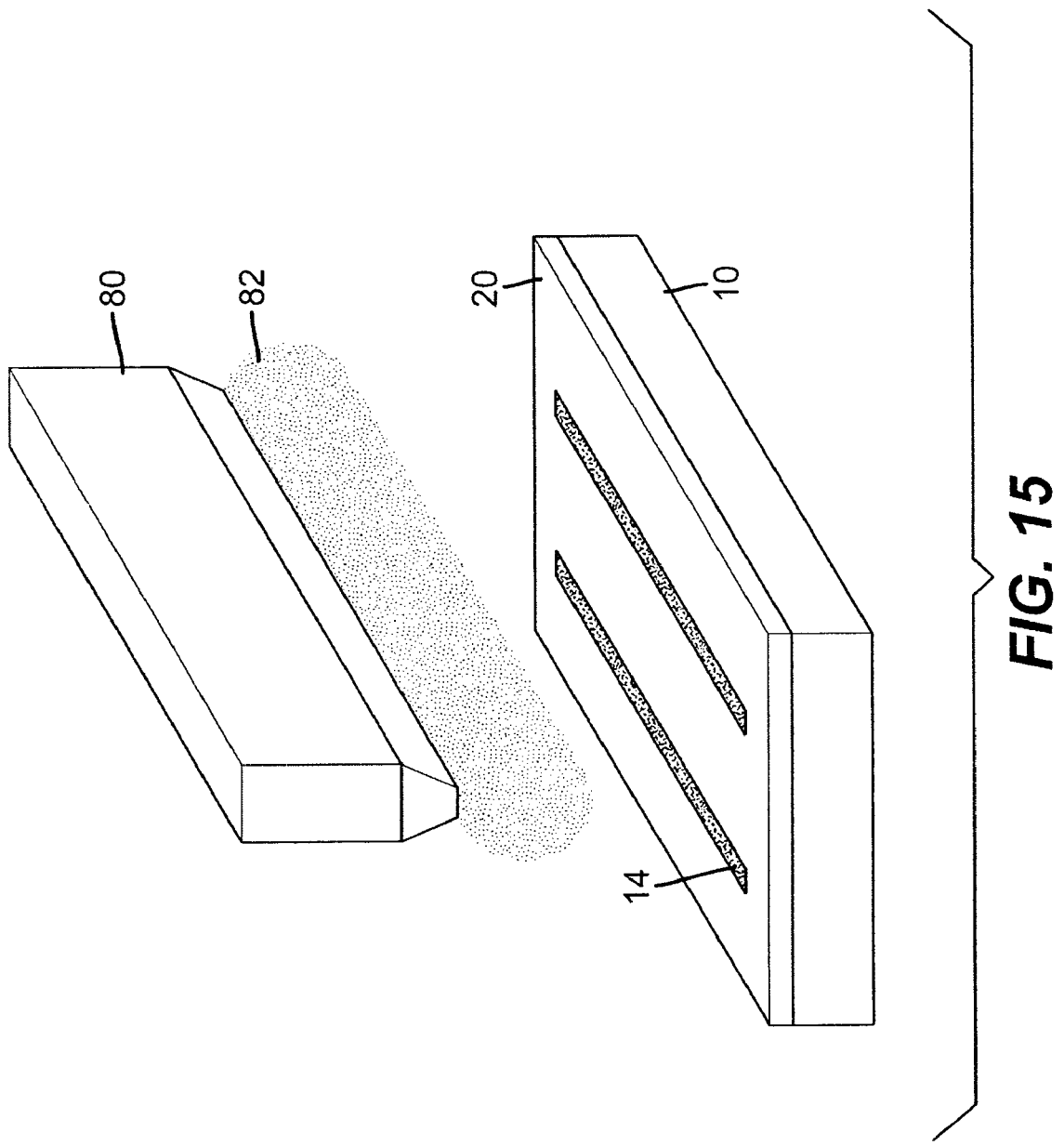
FIG. 15 is a three-dimensional view of a device for evaporating material through opening portions in a mask film useful for the present invention.

Referring to FIG. 15, once the mask hole openings 14 are formed in the masking film 20 in alignment with the light-emitting areas, light-emitting materials are applied over the substrate through the mask hole 14. In the case of small-molecule OLED devices, the light-emitting materials are typically deposited by evaporation in a vacuum from a source, for example, a linear source 80 that forms a plume of organic material 82 that is deposited through the mask holes 14 onto the substrate 10 in the locations of the light-emitters 12.

Figure 16:
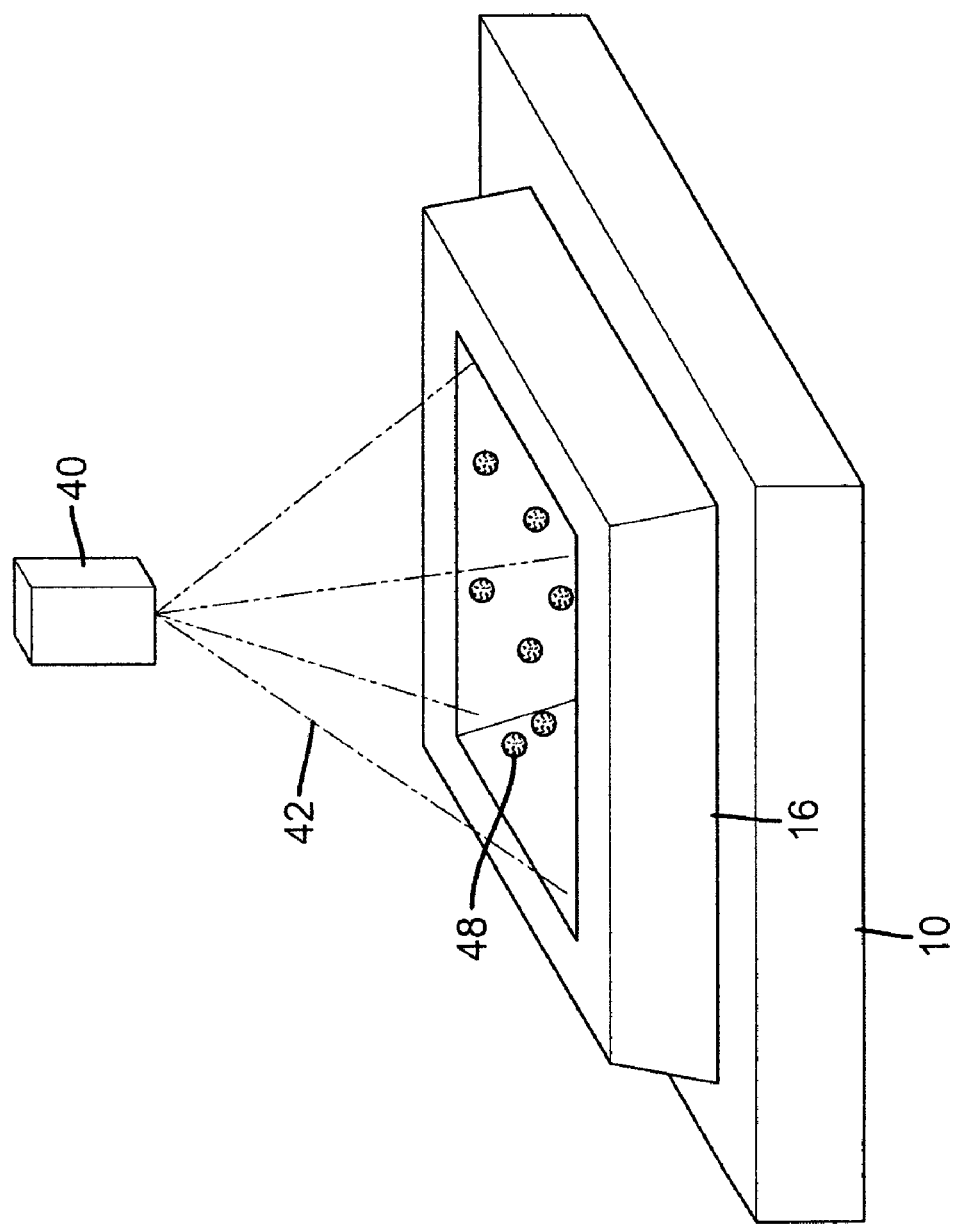
FIG. 16 is a three-dimensional view of contaminating particles within a light-emitting area, and an ablation device useful for the present invention.

Referring to FIG. 16, particulate contamination 48 deposited in the light-emitting areas 12 within a raised area 16 is ablated as well, for example by a laser. Alternatively, plasma cleaning or other chemical or mechanical cleaning is employed if only layers compatible with such cleaning processes are present.

Figure 17A:
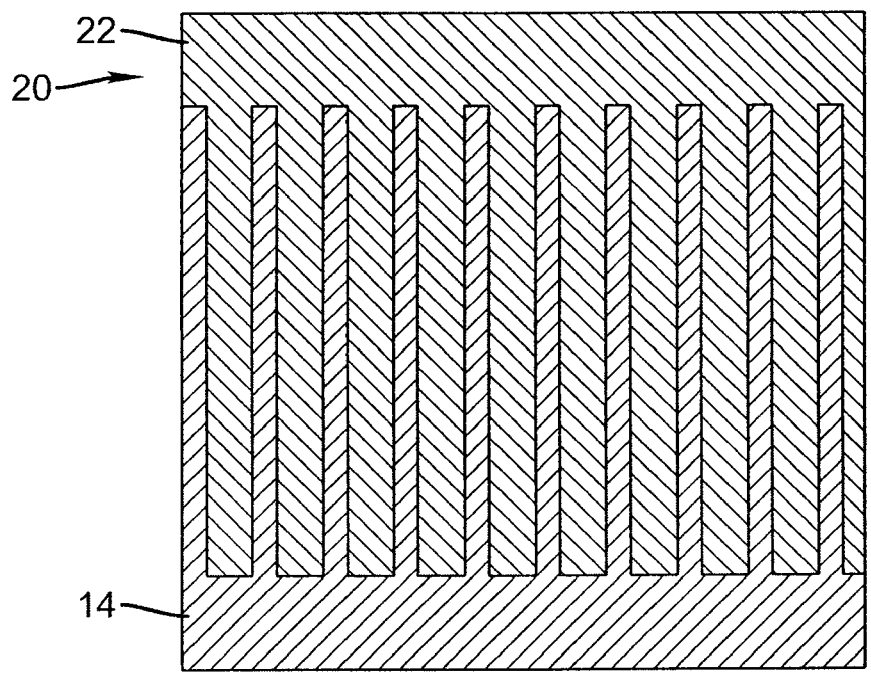
FIGS. 17A-17C are top views of a mask film and contiguous opening portions in a stripe pattern according to an embodiment of the present invention.
Figure 17B:
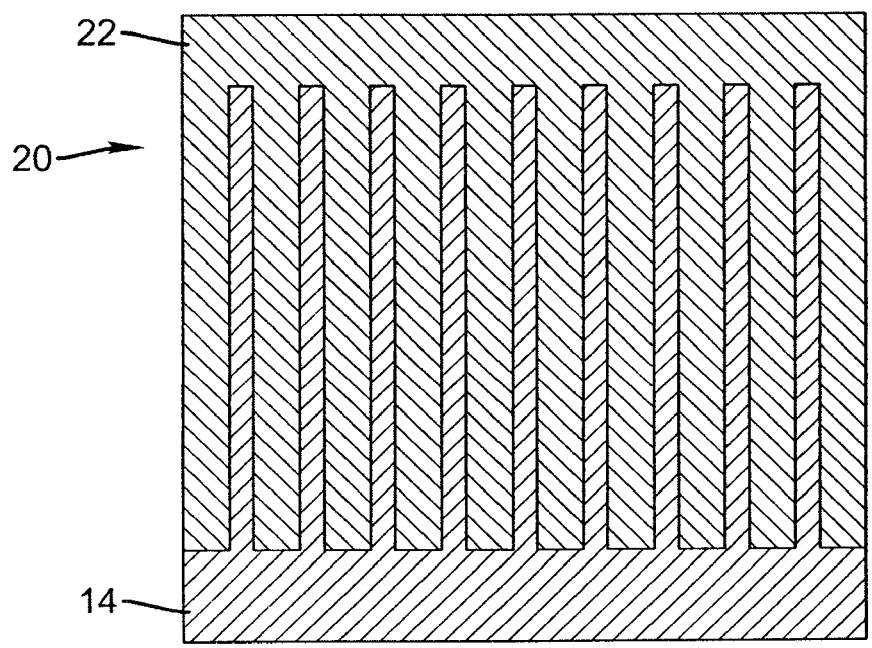
Figure 17C:
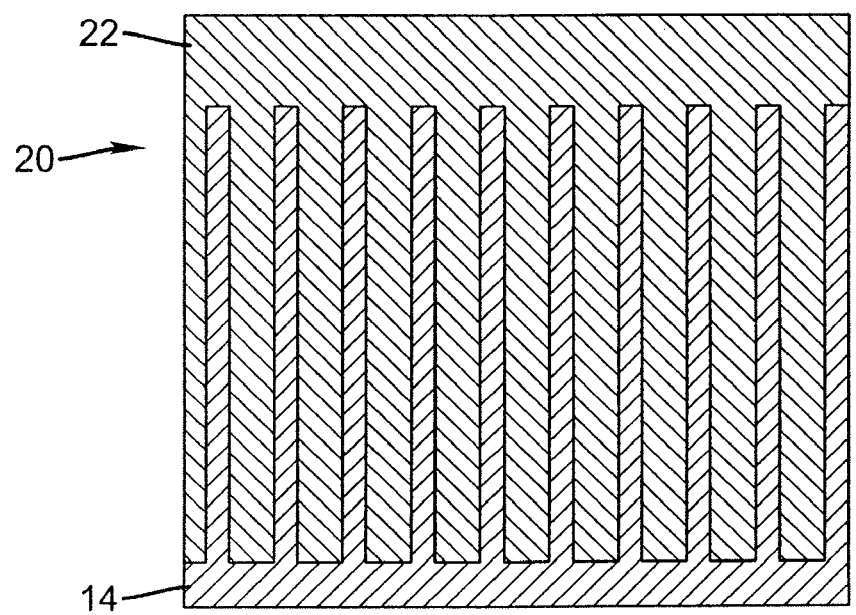

In further embodiments of the present invention, the opening portions 14 are connected to form a single, contiguous opening portion while leaving the remaining masking portion as another contiguous component. Having two contiguous elements simplifies mechanical removal of the segmented portions. Referring to FIG. 17A, a mask film 20 has a contiguous opening portion 14. The contiguous opening portion 14 corresponds in location to stripes of light-emitting areas, for example, as shown in FIG. 6. The stripes of the contiguous opening portion 14 are joined at one end of the stripes, while the remaining masking portion 22 is likewise joined at the other end to form two, segmented, pieces of mask film. By mechanically removing contiguous opening portion 14, for example, by grasping the joined end in a nip and pulling the joined end up and away from an underlying substrate, the entire contiguous opening portion 14 is removed; thereby exposing the stripes of light-emitting elements 12 in one operational step and enabling the deposition of light-emitting materials. The remaining masking portion 22 is likewise removed. Such an approach reduces particulate contamination, since the light-emitting areas 12 on which deposition of light-emitting materials is not intended, are covered during the deposition step and any particulate contamination resulting from ablation of mask film material for segmenting the contiguous opening portion will fall on the masking film 20 itself, rather than into the light-emitting element areas 12. Moreover, mechanical removal of the masking portion or contiguous opening portion 14 is not likely to produce particulate contamination. Referring to FIGS. 17B and 17C, the contiguous opening portions of the mask film corresponding to different stripes of light-emitting elements in different locations are illustrated. As illustrated in FIG. 17A, the contiguous opening portion covers a single first column of pixels along the left edge of the masking film 20. In FIG. 17C, a single second column of pixels on the right of the first column of pixels is covered; while in FIG. 17B a single third column of pixels is covered.

Figure 18:
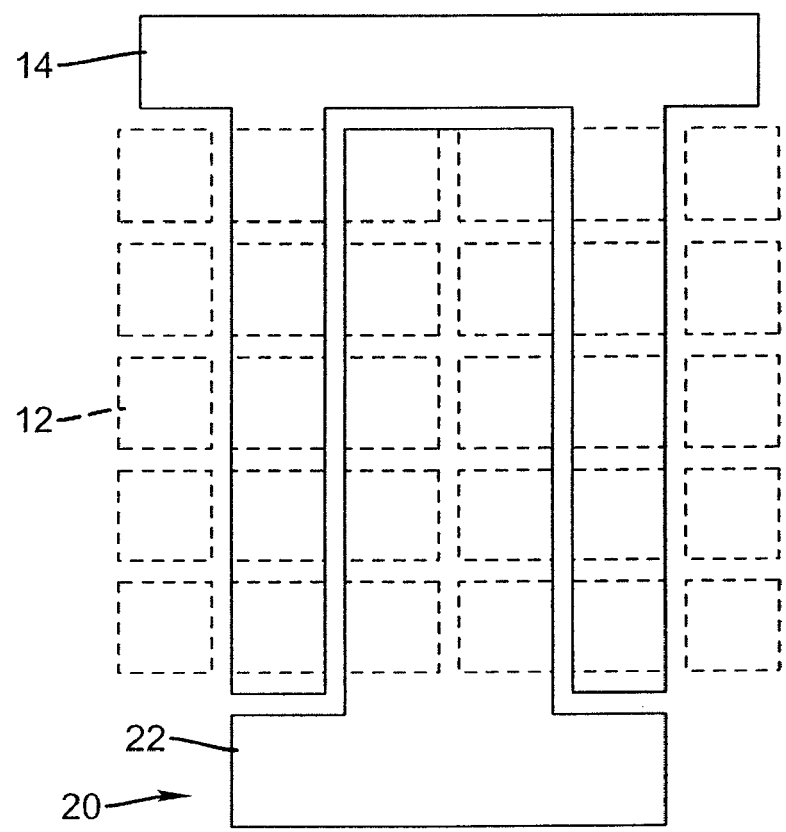
FIG. 18 is a top view of a mask film and contiguous opening portions in a stripe pattern of light-emitting elements according to an embodiment of the present invention.
Figure 19:
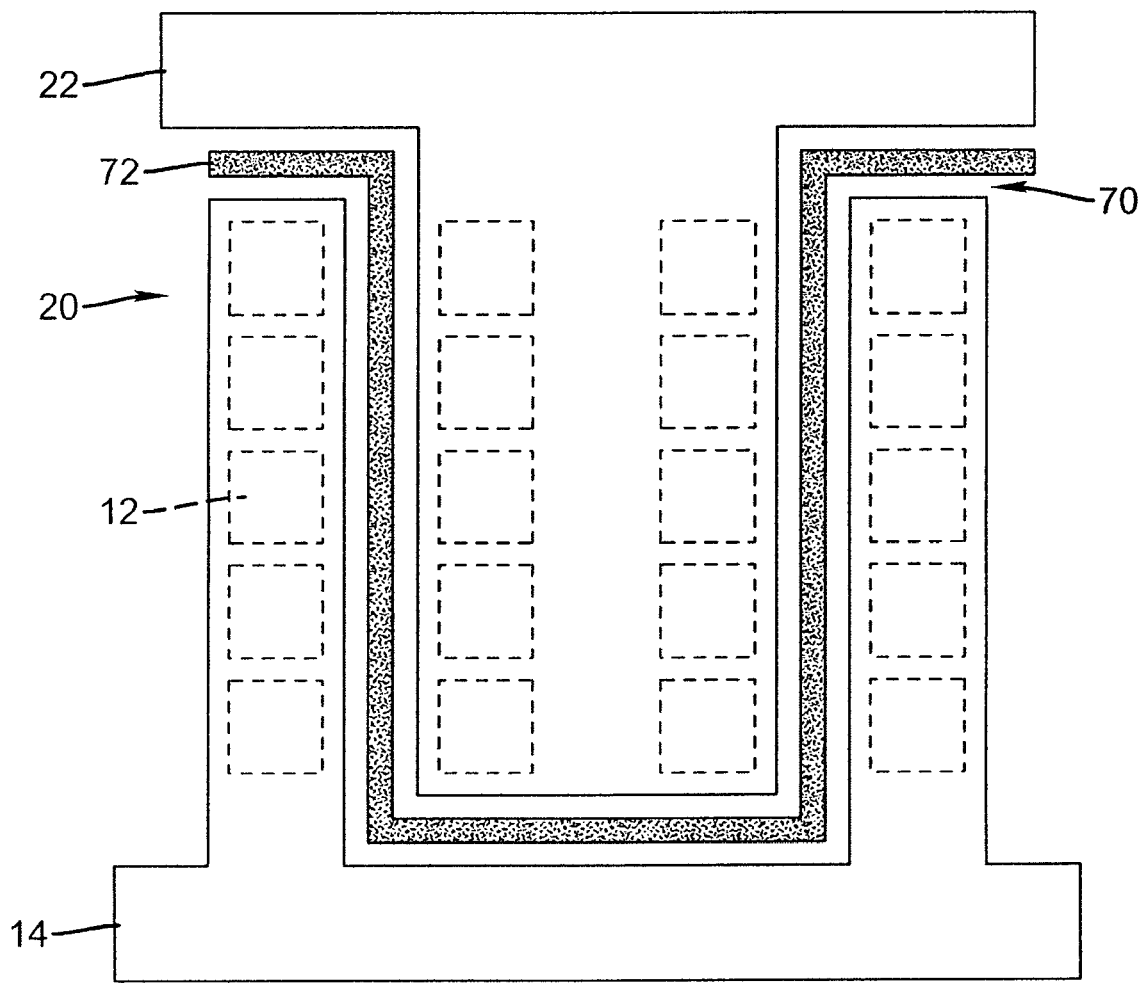
FIG. 19 is a top view of a mask film, contiguous opening portions and exposure path in a stripe of light-emitting elements according to an embodiment of the present invention.

FIG. 18 illustrates a method of the present invention in more detail. Referring to FIG. 18, light-emitting areas 12 are illustrated together with the mask film 20 and masking portion 22 covering two adjacent columns of light-emitting areas (for example red-light emitting and blue-light emitting areas), while the contiguous opening portion 14 covers two, non-adjacent stripes of light-emitting elements (for example green-light emitting). In a yet more detailed illustration of one embodiment of the present invention, FIG. 19 illustrates the path of an ablating beam of laser light employed to form a channel 72 to segment the masking portion 22 of the mask film 20 from the contiguous opening portion 14 and the underlying light-emitting elements 12. As discussed above, an adhesive, possibly patterned in an adhesive area 70, can also be employed. Note that in subsequent steps, the deposition areas may overlap each other so long as the light-emitting areas 12 are properly exposed or covered as the case may be. In such a case, light-emitting materials may be repeatedly deposited on non-light-emitting areas between the light-emitting areas 12. This arrangement helps the physical integrity of the contiguous opening portions 14.

The present invention provides many improvements over the prior art. The masking film may be inexpensive, for example, comprising for example PET (polyethylene teraphthalate) or other low-cost polymers provided in rolls. The film does not have to be repeatedly aligned with the substrate, as do traditional metal masks. Significant temperature dependencies may not arise, since the materials do not necessarily expand significantly in response to temperature; and if significant thermal expansion were to occur, the heat would only slightly decrease the area of the masking holes. If the masking holes were slightly oversized (as would be the case if a perimeter was ablated over a raised area), no effect on the formation of the light-emitting area would result. Because the film covers all of the substrate, except those areas to be patterned with light-emitting materials, the substrate is protected from particulate contamination. Moreover, because a new film is provided for each deposition cycle, particulate contamination, formed by removing masking film material, can be removed when the masking film is mechanically removed. Employing a raised area around the light-emitting areas likewise prevents damage to any pre-existing light-emitting areas, as does ablating a perimeter over the raised areas around mask holes. In any case, the masking film is sufficiently thin that touching any delicate layers of, for example, organic materials, on the substrate does not damage the layers.

The present invention also provides a scalable means for manufacturing patterned light-emitting devices, since the masking film can be readily made in large sizes. Laser systems useful for ablating masking film materials may comprise many separate lasers, therefore enabling fast patterning. Such laser systems are known in the art. Mechanical removal of the mask film material enables fast turnaround on arbitrarily large substrates. The present invention can be employed in continuous processing systems.

The method of the present invention also finds application in the fabrication of other kinds of photonic and electronic devices, such as reflective and transmissive color displays where several materials used to construct the pixels require separate masks. This is particularly true in the case of color devices that generally require three separate colored materials to be patterned differently. Typically these devices also require a transparent conductor such as indium-tin-oxide, which may be deposited by sputtering and is conveniently patterned by one mask step using the present invention. Active-matrix displays, thin film transistors (TFTs), and capacitors can be fabricated for an active-matrix pixel. The TFT's gate dielectric and semiconductor layers typically require separate masks. Metal tracks can also be conveniently patterned by the present invention, and again will require a separate mask or masks. Other photonic devices such as photodetectors, photovoltaic cells, and optical waveguide structures can also be fabricated using the method of the present invention.

The present invention can be practiced with either active- or passive-matrix organic or inorganic LED devices. It may also be employed in display devices or in area illumination devices. In one embodiment, the present invention is employed in a flat-panel OLED device composed of small molecule or polymeric OLEDs, as disclosed in, but not limited to U.S. Pat. No. 4,769,292, issued Sep. 6, 1988 to Tang et al.; and U.S. Pat. No. 5,061,569, issued Oct. 29, 1991 to VanSlyke et al. Many combinations and variations of organic light-emitting displays can be used to fabricate such a device, including both active- and passive-matrix OLED displays having either a top- or bottom-emitter architecture. Inorganic or polymer light-emitting materials can also be employed and patterned according to the method of the present invention.

The invention has been described in detail with particular reference to certain preferred embodiments thereof, but it will be understood that variations and modifications can be effected within the spirit and scope of the invention.

PARTS LIST 10 substrate
11 pixel
12 light-emitting area or element
12R red light-emitting area
12G green light-emitting area
12B blue light-emitting area
12X non light-emitting area
14 mask hole, contiguous opening portion
14R opening in masking film for red light-emitter
14G opening in masking film for green light-emitter
14B opening in masking film for blue light-emitter
14X mask hole perimeter
14Y mask hole material within perimeter of mask hole
16 raised area
20 masking film
21 opening portion
22 masking portion
23 second masking film
24 second opening portion
25 second masking portion
26 third masking film
27 third opening portion
28 third masking portion
29 removal film 30 roll of masking film
40 laser
42 beam of light
43 vaporized material
44, 46 direction
48 contaminating particles
50 first materials
51 second materials
52 third materials
60 adhesive
70 patterned adhesive area
72 channel
80 linear source
82 plume of evaporated particles
100 locate first masking film step
105 segment first masking film step
110 remove first opening portions step
115 deposit first materials step
120 mechanically locate second masking film step
125 segment second masking film step
130 remove second opening portions step
135 deposit second materials step
140 remove masking portions step

The invention claimed is:

1. A method of patterning a substrate, comprising the sequential steps of:
  a) providing a pre-formed first masking film and then physically locating the pre-formed first masking film over the substrate;
  b) removing one or more first opening portions in first locations in the located pre-formed first masking film forming one or more first masking portions and one or more first openings in the located pre-formed first masking film;
  c) depositing first materials over the substrate through the first openings in the first locations to form first patterned areas;
  d) subsequent to the deposition of the first materials, providing a pre-formed second masking film and then physically locating the pre-formed second masking film over the substrate and located pre-formed first masking portions, wherein the pre-formed second masking film is not formed inside the first openings;
  e) removing one or more second opening portions in second locations, different from the first locations, in both the located pre-formed second masking film and the first masking portions to form one or more second masking portions and one or more second openings;
  f) depositing second materials over the substrate through the second openings in the second locations to form second patterned areas; and
  g) wherein an adhesive layer is provided between the pre-formed second masking film and the first masking portions, and then adhering the pre-formed second masking film to the first masking portions;
  h) picking up and removing the first and second masking portions after the second materials are deposited.

2. The method of claim 1 wherein the adhesive layer is formed on the pre-formed first masking film before the pre-formed first masking film is physically located over the substrate, or the adhesive layer is formed on the pre-formed first masking film after the pre-formed first masking film is physically located over the substrate prior to removing the first opening portions, or the adhesive layer is formed on the pre-formed first masking portions subsequent to removing the first opening portions.

3. The method of claim 1 further comprising the steps of segmenting the first or second opening portions from the first or second masking portions, and forming the adhesive layer on the pre-formed first masking film or pre-formed second masking film before the segmenting step, or forming the adhesive layer on the pre-formed first masking film or pre-formed second masking film after the segmenting step.

4. The method of claim 1, wherein the step of adhering the pre-formed second masking film to the first masking portions or first opening portions includes one or more of the following steps: heating the adhesive, exposing the adhesive to radiation, or applying mechanical pressure to the pre-formed second masking film to press the pre-formed second masking film against the first masking portions or first opening portions.

5. The method of claim 1, wherein the pre-formed second masking film is pattern-wise adhered to the first masking portions or adhered to the first opening portions.

6. The method of claim 1, further including the step of curing the adhesive.

7. The method of claim 1, further wherein the adhesive layer is formed on the pre-formed first masking film on a side of the pre-formed first masking film opposite the substrate, after the pre-formed first masking film has been physically located over the substrate.

8. The method of claim 1, wherein the adhesive layer is formed by spraying, inkjetting, screen printing, roll coating, or coating an adhesive on a side opposite the substrate for either the first masking portions or the first opening portions, or both.

9. The method of claim 1, further comprising the sequential steps of:
  h) providing a third masking film and then physically locating the third masking film over the substrate and second masking portions;
  i) removing one or more third opening portions in third locations, different from the first and second locations, in both the pre-formed third masking film and the second masking portions to form one or more third masking portions in the pre-formed third masking film; and
  j) depositing third materials over the substrate in the third locations to form third patterned areas.

10. The method of claim 9, further comprising the step of: picking up and removing the first, second, and third masking portions after the third materials are deposited.

11. The method of claim 1, wherein the first or second opening portions are contiguous.

12. The method of claim 1, further comprising the step of providing an adhesive between the substrate and the first masking film.

13. The method of claim 1, wherein the first or second masking film is light absorbing.

14. The method of claim 1, wherein the first and second patterned areas are spatially separated over the substrate and further comprising the step of forming raised areas in the areas between the first and second patterned areas before the pre-formed first masking film is physically located.

* * * * *